US012614694B2

(12) United States Patent
Liao

(10) Patent No.: US 12,614,694 B2
(45) Date of Patent: Apr. 28, 2026

(54) TRANSMISSION ELECTRON MICROSCOPE IN-SITU CHIP AND PREPARATION METHOD THEREFOR

(71) Applicant: Xiamen Chip-Nova Technology Co., Ltd., Xiamen (CN)

(72) Inventor: Honggang Liao, Xiamen (CN)

(73) Assignee: Xiamen Chip-Nova Technology Co., Ltd., Xiamen (CN)

( * ) Notice: Subject to any disclaimer, the term of this patent is extended or adjusted under 35 U.S.C. 154(b) by 470 days.

(21) Appl. No.: 17/987,991

(22) Filed: Nov. 16, 2022

(65) Prior Publication Data

US 2023/0072075 A1      Mar. 9, 2023

Related U.S. Application Data

(62) Division of application No. 17/911,058, filed as application No. PCT/CN2020/111183 on Aug. 26, 2020.

(30) Foreign Application Priority Data

Mar. 12, 2020    (CN) .......................... 202010170783.3
Mar. 12, 2020    (CN) .......................... 202010171038.0
Mar. 12, 2020    (CN) .......................... 202010171989.8

(51) Int. Cl.
*H01J 37/26*          (2006.01)
*G01N 23/2204*       (2018.01)
(Continued)

(52) U.S. Cl.
CPC ........ *H01J 37/261* (2013.01); *G01N 23/2204* (2013.01); *G01N 23/2251* (2013.01);
(Continued)

(58) Field of Classification Search
CPC .......... H01J 37/261; H01J 37/04; H01J 37/20; H01J 37/263; H01J 2237/2002;
(Continued)

(56) References Cited

U.S. PATENT DOCUMENTS

2004/0011782 A1*    1/2004    Ito .......................... H05B 3/143
                                                            219/465.1
2008/0179518 A1*    7/2008    Creemer ................. H01J 37/26
                                                            250/311
(Continued)

*Primary Examiner* — Wyatt A Stoffa
*Assistant Examiner* — Laura Eloise Tandy
(74) *Attorney, Agent, or Firm* — Cooper Legal Group, LLC

(57)        ABSTRACT

The present disclosure discloses a transmission electron microscope in-situ chip and a preparation method thereof. The transmission electron microscope in-situ chip includes a transmission electron microscope high-resolution in-situ gas phase heating chip, a transmission electron microscope high-resolution in-situ liquid phase heating chip and a transmission electron microscope in-situ electrothermal coupling chip. The transmission electron microscope high-resolution in-situ gas phase heating chip and the transmission electron microscope high-resolution in-situ liquid phase heating chip are respectively suitable for gas samples and liquid samples, and the transmission electron microscope in-situ electrothermal coupling chip realizes the multi-functional embodiment of electrothermal coupling. The three transmission electron microscope in-situ chips have the advantages of high resolution and low sample drift rate.

10 Claims, 13 Drawing Sheets

(51) Int. Cl.

| | |
|---|---|
| *G01N 23/2251* | (2018.01) |
| *H01J 37/04* | (2006.01) |
| *H01J 37/20* | (2006.01) |
| *H05B 3/06* | (2006.01) |
| *H05B 3/12* | (2006.01) |
| *H05B 3/20* | (2006.01) |
| *H05B 3/26* | (2006.01) |
| *H10N 10/81* | (2023.01) |
| *H10P 95/00* | (2026.01) |

(52) U.S. Cl.
CPC .............. *H01J 37/04* (2013.01); *H01J 37/20* (2013.01); *H01J 37/263* (2013.01); *H05B 3/265* (2013.01); *H10N 10/81* (2023.02); *H01J 2237/2002* (2013.01); *H01J 2237/2065* (2013.01); *H05B 2203/002* (2013.01)

(58) Field of Classification Search
CPC ....... H01J 2237/2065; H01J 2237/2003; H01J 37/26; G01N 23/2204; G01N 23/2251; H05B 3/265; H05B 2203/002; H05B 3/06; H05B 3/12; H05B 2203/014; H05B 2203/022; H05B 3/20; H10N 10/81; H01L 21/02
See application file for complete search history.

(56)           References Cited

U.S. PATENT DOCUMENTS

| | | | |
|---|---|---|---|
| 2012/0298883 A1* | 11/2012 | Grogan ................... | H01J 37/28 156/60 |
| 2014/0038224 A1* | 2/2014 | Yu .......................... | G01N 27/27 422/82.01 |
| 2017/0067842 A1* | 3/2017 | Ahn ................... | G01N 33/0027 |
| 2018/0376537 A1* | 12/2018 | Zandbergen ............ | H01J 37/20 |
| 2020/0027691 A1* | 1/2020 | Wu .......................... | H01J 37/20 |

* cited by examiner

Time t (s)

TRANSMISSION ELECTRON MICROSCOPE IN-SITU CHIP AND PREPARATION METHOD THEREFOR

CROSS-REFERENCE TO RELATED APPLICATIONS

The present application is a divisional of U.S. patent application Ser. No. 17/911,058, filed on Sep. 12, 2022, which is a national stage entry of International Patent Application PCT/CN2020/111183, filed on Aug. 26, 2020, which claims priority to Chinese Patent Application 202010170783.3, filed on Mar. 12, 2020, Chinese Patent Application 202010171989.8, filed on Mar. 12, 2020, and Chinese Patent Application 202010171038.0, filed on Mar. 12, 2020. U.S. patent application Ser. No. 17/911,058, International Patent Application PCT/CN2020/111183, and Chinese Patent Applications 202010170783.3, 202010171989.8, and 202010171038.0 are incorporated herein by reference.

TECHNICAL FIELD

The present disclosure relates to the field of chips, in particular to a transmission electron microscope in-situ chip and a preparation method thereof.

BACKGROUND

In-situ transmission electron microscope (TEM) technology is widely used in various scientific fields due to its ultra-high spatial resolution (atomic level) and ultra-fast temporal resolution (millisecond level), which provides new ideas and research methods for researchers to explore the microstructure of new materials. With the deepening and diversification of scientific research in various fields, researchers have started to try to use in-situ transmission electron microscopes for further studies, such as electrocatalytic performance studies, battery material testing, photocatalytic reactions, and high-temperature reactions. This requires the introduction of external fields such as thermal, optical, electrochemical, and fluid fields, as well as external field effects such as atmosphere and solution environment in electron microscope tests.

High-temperature gas phase reactions are the focus of traditional thermal catalysis researches. Gas phase organic molecules are catalyzed to react on surfaces of metal or oxide catalysts at high temperatures to produce new organic molecules, and the high temperatures are favorable for reactants to cross reaction energy barriers to break bonds and form new chemical bonds. Due to the lack of in-situ studies, we know very little about the changes in catalyst morphology, structure and atomic arrangement. Through in-situ gas phase TEM heating technology, researchers can track changes in morphology, structure, surface atomic arrangement, and reactive sites of catalyst particles in real time, which has important guiding significance for the structure optimization, performance improvement, and product species selectivity optimization of catalysts in the field of high temperature thermocatalysis.

At the same time, with the development of nanomaterial, the synthesis of nanomaterial has become a popular science today. The synthesis of nanomaterials is overwhelmingly a temperature-controlled reaction in the solution phase, and temperature not only affects an activation energy barrier of a molecular reaction, but also affects the rate of material exchange during the reaction. Researchers can obtain detailed results of the material change process through in-situ liquid phase TEM fluid heating technology, and obtain information on the morphology, structure, crystal morphology, etc. of the material at different temperatures by controlling the temperature, which is of great significance for to the synthesis of nano-energy materials and growth process mechanisms thereof, and also plays an important role in guiding the synthesis of nanomaterial.

A single-function electrochemical chip or heating chip can only be used for electrochemical or heating chemical reactions. For some material with poor conductivity, conductivity may be increased by heating, thereby causing a reaction. For example, the conductivity of polymer ion conductors at room temperature is $10^{-3}$-$10^{-4}$ $\mu$S/cm, but if the temperature rises to 60° C., the conductivity increases sharply. In addition, with the increase of temperature, the movement of ions and molecules in the solution is more intense, which is more conducive to the exchange of substances, thus affecting the structure of a double electric layer during an electrochemical reaction. The performance and product types of catalytic material at different temperatures can be studied by the electrothermal coupling chip. In contrast, the single-function in-situ chip can only choose either electrochemistry or heating, which can only meet the requirements of part of chemical reaction systems.

SUMMARY

The present disclosure aims to provide a transmission electron microscope high-resolution in-situ gas phase heating chip with rapid temperature rise and fall, high resolution, controllable gas flow direction and low sample drift rate.

In order to achieve the above purpose, the present disclosure provides a transmission electron microscope high-resolution in-situ gas phase heating chip. The transmission electron microscope high-resolution in-situ gas phase heating chip structurally includes a top chip and a bottom chip combined via a metal bonding layer, the top chip and the bottom chip each including a front side and a back side, the front side of the top chip being directly bonded to the front side of the bottom chip via the metal bonding layer to be self-sealed to form an ultra-thin chamber, and the top chip and the bottom chip being each made of a silicon substrate with silicon nitride or silicon oxide on two sides.

The top chip is provided with two sample injection ports and a central window 1, the central window 1 is located in a center of the top chip, and the two sample injection ports are symmetrically disposed with respect to the central window 1;

the bottom chip is provided with a gas inlet, a gas outlet, a support layer, a heating layer, an insulating layer, a hole and a central window 2; the heating layer is provided with four contact electrodes and a spiral annular heating wire, the spiral annular heating wire is in a symmetrical shape, the heating wire is spaced and disconnected from each other, and the four contact electrodes are disposed at an edge of the chip; in a region with the central window as a center and being larger than an outer edge of the spiral annular heating wire, the hole is reserved by completely etching silicon, and the support layer covers the hole, and is suspended on the silicon substrate with the hole; the heating wire in a center of the heating layer is disposed at a position, above the hole, of the support layer and is not in direct contact with the silicon substrate; the gas inlet and the gas outlet are disposed symmetrically with respect to the central window 2; the central window 2 is located in the center of the heating layer and is not shielded by a heating material; and an area of the top chip is slightly smaller than an area of the bottom chip, the central windows of the top chip and the bottom chip are aligned, and a plurality of pores are provided in the central window 1 and the central window 2.

Further, an external dimension of the bottom chip is 2*2-10*10 mm, and preferably, the external dimension of the bottom chip is 4*8 mm; and optionally, a thickness of the metal bonding layer is 50 nm-2000 nm, the metal bonding layer is made of low melting point metal, and preferably, the metal bonding layer is made of In, Sn or Al.

Further, a thickness of the silicon nitride or silicon oxide is 5-200 nm; and optionally, a thickness of the silicon substrate is 50-500 μm.

Further, the hole is circular or square;

optionally, the support layer is silicon nitride or silicon oxide, with a thickness of 0.5-5 μm;

optionally, the central window 1 and the central window 2 are square central windows; preferably, a size of the square central windows is 5 μm*5 μm-100 μm*100 μm; more preferably, the size of the square central windows is 20 μm*50 μm; and optionally, a size of the pores is 0.5 μm-5 μm.

Further, the heating layer is set as two equivalent circuits, the two equivalent circuits are controlled by separate current source meters and voltage source meters, one of the two equivalent circuits is used for supplying power to produce heat, and the other circuit is used for monitoring a resistance value of the heating wire after heating in real time.

Optionally, an outer diameter of the spiral annular heating wire of the heating layer is 0.15-0.5 mm, and a thickness thereof is 50 nm-500 nm; and optionally, the spiral annular heating wire is made of metallic gold, platinum, palladium, rhodium, molybdenum, tungsten, platinum-rhodium alloy or non-metallic molybdenum carbide.

Further, the size of the gas inlet or gas outlet is determined by allowing etching to end till the front side of the silicon substrate of the bottom chip such that the reserved film window in the silicon nitride or silicon oxide on the front side is not greater than 500 μm*500 μm and not smaller than 200 μm*200 μm.

Further, a preparation method of the top chip includes:

S1. transferring a pattern of the central window from a lithography mask to an Si(100) wafer A with silicon nitride or silicon oxide layers on two sides by using a lithography process, and then developing in a positive photoresist developer to obtain a wafer A-1, preferably, the lithography process being exposure in a hard contact mode of an ultraviolet lithography machine, a thickness of the silicon nitride or silicon oxide layers being 5-200 nm, the development time being 50 s, and more preferably, the exposure time being 15 s;

S2. etching a silicon nitride layer on a front side of the wafer A-1 by using a reactive ion etching process to obtain the central window, then soaking the wafer A-1 in acetone with the front side up, and finally rinsing the wafer with a large amount of deionized water to remove photoresist to obtain a wafer A-2;

S3. transferring a pattern of the pores of the central window from the lithography mask to the front side of the wafer A-2 by using an ultraviolet laser direct writing process, then developing in the positive photoresist developer, and rinsing a surface with deionized water to obtain a wafer A-3, preferably, the development time being 50 s;

S4. etching silicon nitride at pores in a back side of the wafer A-3 by using the reactive ion etching process until a thickness is 10 nm-15 nm, then soaking the wafer A-3 in acetone with the front side up successively, and finally rinsing the wafer with acetone to remove photoresist to obtain a wafer A-4, preferably, a size of the pores being 0.5 μm-5 μm;

S5. placing the wafer A-4 into a potassium hydroxide solution for wet etching with the back side up, ending etching until only a film window is reserved in the front side, taking out the wafer A-4, and rinsing the wafer with a large amount of deionized water to obtain a wafer A-5, preferably, the mass percentage concentration of the potassium hydroxide solution being 20%, the etching temperature being 80° C., the etching time being 1.5-4 h, and more preferably, the etching time being 2 h;

S6. transferring a pattern of the bonding layer from the lithography mask to the front side of the wafer A-5 by using the lithography process, then developing in the positive photoresist developer, and rinsing the surface with deionized water to obtain a wafer A-6, preferably, the lithography process being exposure in the hard contact mode of the ultraviolet lithography machine, the development time being 50 s, and more preferably, the exposure time being 15 s;

S7. evaporating a metal bonding material on the wafer A-6 by using a thermal evaporation coating process to form the metal bonding layer to obtain a wafer A-7, preferably, low melting point metal being adopted, a thickness of the metal bonding layer being 50-2000 nm, and more preferably, the metal being In, Sn or Al; and S8. performing laser scribing on the wafer A-7 to obtain an independent chip, that is, the top chip.

Further, a preparation method of the bottom chip includes:

S1. preparing an Si(100) wafer B with silicon nitride or silicon oxide layers on two sides, a thickness of the silicon nitride or silicon oxide layers being 5-200 nm;

S2. transferring patterns of a gas runner hole and a heating region carrier film from a lithography mask to a front side of the wafer by using a lithography process, then developing in a positive photoresist developer, and cleaning a surface with deionized water to obtain a wafer B-1, preferably, the lithography process being exposure in a hard contact mode of an ultraviolet lithography machine, photoresist adopted in the lithography process being AZ5214E, the development time being 65 s, and more preferably, the exposure time being 20 s;

S3. etching a silicon nitride layer on a back side of the wafer B-1 to obtain the central window, the gas inlet and the gas outlet, and etching away silicon nitride or silicon oxide at a heating region by using a reactive ion etching process, then soaking the wafer in acetone with the back side up successively, and finally rinsing the wafer with acetone to remove the photoresist to obtain a wafer B-2, preferably, an outer diameter of the spiral annular heating wire of the heating layer being 0.15-0.5 mm, and a thickness thereof being 50 nm-500 nm;

S4. placing the wafer B-2 into a potassium hydroxide solution for wet etching with the back side up, ending etching until exposed base silicon is completely etched, taking out the wafer B-2, rinsing the wafer with a large amount of deionized water, and blowing the wafer dry to obtain a wafer B-3, preferably, the mass percentage concentration of the potassium hydroxide solution being 20%, the etching temperature being 70-90° C., the etching time being 1.5-4 h, and more preferably, the etching temperature being 80° C., and the etching time being 2 h;

S5. transferring patterns of the gas inlet and the gas outlet from the lithography mask to the front side of the wafer B-3 by using the lithography process, then developing in the positive photoresist developer, and cleaning the surface with deionized water to obtain a wafer B-4, preferably, the lithography process being exposure in the hard contact mode of the ultraviolet lithography machine, the photoresist for the lithography process being AZ5214E, the development time being 65 s, and more preferably, the exposure time being 20 s;

S6, etching a silicon nitride or silicon oxide film at the gas inlet and the gas outlet in the front side of the wafer B-4 away by using the reactive ion etching process to form a hole allowing gas to pass through, then soaking the wafer in acetone with the front side up, and finally rinsing the wafer with acetone to remove the photoresist to obtain a wafer B-5;

S7. growing silicon oxide or silicon nitride on a front side of an etched silicon substrate of the wafer B-5 by using a plasma enhanced chemical vapor deposition (PECVD) process to obtain a wafer B-6, preferably, a thickness of the silicon oxide or silicon nitride being 0.5-5 μm;

S8. transferring a pattern of the heating wire from the lithography mask to the front side of the wafer B-6 by using the lithography process, then developing in the positive photoresist developer, and rinsing the surface with deionized water to obtain a wafer B-7, preferably, the lithography process being exposure in the hard contact mode of the ultraviolet lithography machine, the photoresist adopted in the lithography process being AZ5214E, the development time being 50 s, and more preferably, the exposure time being 15 s;

S9. evaporating a metal heating wire layer on the front side of the wafer B-7 by electron beam evaporation, then soaking the wafer B-7 in acetone with the front side up for peeling, and finally rinsing the wafer with deionized water to remove the photoresist and reserve the metal heating wire, so as to obtain a wafer B-8, preferably, the metal heating wire being made of metallic gold, platinum, palladium, rhodium, molybdenum, tungsten, platinum-rhodium alloy or non-metallic molybdenum carbide, and a thickness of the metal heating wire being 50 nm-500 nm;

S10. growing a silicon nitride or silicon oxide or aluminum oxide layer on the metal heating wire of the wafer B-8 by using the PECVD process as the insulating layer to obtain a wafer B-9, preferably, a thickness of the insulating layer being 30-150 nm;

S11. transferring a pattern of the pores of the central window from the lithography mask to the front side of the wafer B-9 by using an ultraviolet laser direct writing lithography process, then developing in the positive photoresist developer, and rinsing the surface with deionized water to obtain a wafer B-10, preferably, photoresist adopted in the ultraviolet laser direct writing process being AZ5214E, and output power being 260 W/μs;

S12, etching silicon nitride or silicon oxide at the pores in the back side of the wafer B-10 by using the reactive ion etching process, then soaking the wafer B-10 in acetone with the front side up, and finally rinsing the wafer with acetone to remove the photoresist to obtain a wafer B-11, preferably, a size of the pores being 0.5 μm-5 μm; and S13. performing laser scribing on the wafer B-11 to obtain an independent chip, that is, the bottom chip.

The present disclosure further provides a preparation method of the transmission electron microscope high-resolution in-situ gas phase heating chip. The preparation method preparing a top chip:

S1. transferring a pattern of a central window from a lithography mask to an Si(100) wafer A with silicon nitride or silicon oxide layers on two sides by using a lithography process, and then developing in a positive photoresist developer to obtain a wafer A-1, preferably, the lithography process being exposure in a hard contact mode of an ultraviolet lithography machine, a thickness of the silicon nitride or silicon oxide layers being 5-200 nm, the development time being 50 s, and more preferably, the exposure time being 15 s;

S2, etching a silicon nitride layer on a front side of the wafer A-1 by using a reactive ion etching process to obtain the central window, then soaking the wafer A-1 in acetone with the front side up, and finally rinsing the wafer with a large amount of deionized water to remove photoresist to obtain a wafer A-2;

S3. transferring a pattern of pores of the central window from the lithography mask to the front side of the wafer A-2 by using an ultraviolet laser direct writing process, then developing in the positive photoresist developer, and rinsing a surface with deionized water to obtain a wafer A-3, preferably, the development time being 50 s;

S4, etching silicon nitride at pores in a back side of the wafer A-3 by using the reactive ion etching process until a thickness is 10 nm-15 nm, then soaking the wafer A-3 in acetone with the front side up successively, and finally rinsing the wafer with acetone to remove photoresist to obtain a wafer A-4, preferably, a size of the pores being 0.5 μm-5 μm;

S5. placing the wafer A-4 into a potassium hydroxide solution for wet etching with the back side up, ending etching until only a film window is reserved in the front side, taking out the wafer A-4, and rinsing the wafer with a large amount of deionized water to obtain a wafer A-5, preferably, the mass percentage concentration of the potassium hydroxide solution being 20%, the etching temperature being 80° C., the etching time being 1.5-4 h, and more preferably, the etching time being 2 h;

S6. transferring a pattern of a bonding layer from the lithography mask to the front side of the wafer A-5 by using the lithography process, then developing in the positive photoresist developer, and rinsing the surface with deionized water to obtain a wafer A-6, preferably, the lithography process being exposure in the hard contact mode of the ultraviolet lithography machine, the development time being 50 s, and more preferably, the exposure time being 15 s;

S7. evaporating a metal bonding material on the wafer A-6 by using a thermal evaporation coating process to form the metal bonding layer to obtain a wafer A-7, preferably, low melting point metal being adopted, a thickness of the metal bonding layer being 50-2000 nm, and more preferably, the metal being In, Sn or Al; and S8. performing laser scribing on the wafer A-7 to obtain an independent chip, that is, the top chip;

preparing a bottom chip:

S1. preparing an Si(100) wafer B with silicon nitride or silicon oxide layers on two sides, a thickness of the silicon nitride or silicon oxide layers being 5-200 nm;

S2. transferring patterns of a gas runner hole and a heating region carrier film from a lithography mask to a front side of the wafer by using a lithography process, then developing in a positive photoresist developer, and cleaning a surface with deionized water to obtain a wafer B-1, preferably, the lithography process being exposure in a hard contact mode of an ultraviolet lithography machine, photoresist adopted in the lithography process being AZ5214E, the development time being 65 s, and more preferably, the exposure time being 20 s;

S3, etching a silicon nitride layer on a back side of the wafer B-1 to obtain a central window, a gas inlet and a gas outlet, and etching away silicon nitride or silicon oxide at a heating region by using a reactive ion etching process, then soaking the wafer in acetone with the back side up successively, and finally rinsing the wafer with acetone to remove the photoresist to obtain a wafer B-2, preferably, an outer diameter of a spiral annular heating wire of a heating layer being 0.15-0.5 mm, and a thickness thereof being 50 nm-500 nm;

S4. placing the wafer B-2 into a potassium hydroxide solution for wet etching with the back side up, ending etching until exposed base silicon is completely etched, taking out the wafer B-2, rinsing the wafer with a large amount of deionized water, and blowing the wafer dry to obtain a wafer B-3, preferably, the mass percentage concentration of the potassium hydroxide solution being 20%, the etching temperature being 70-90° C., the etching time being 1.5-4 h, and more preferably, the etching temperature being 80° C., and the etching time being 2 h;

S5. transferring patterns of the gas inlet and the gas outlet from the lithography mask to the front side of the wafer B-3 by using the lithography process, then developing in the positive photoresist developer, and cleaning the surface with deionized water to obtain a wafer B-4, preferably, the lithography process being exposure in the hard contact mode of the ultraviolet lithography machine, the photoresist for the lithography process being AZ5214E, the development time being 65 s, and more preferably, the exposure time being 20 s;

S6. etching a silicon nitride or silicon oxide film at the gas inlet and the gas outlet in the front side of the wafer B-4 away by using the reactive ion etching process to form a hole allowing gas to pass through, then soaking the wafer in acetone with the front side up, and finally rinsing the wafer with acetone to remove the photoresist to obtain a wafer B-5;

S7. growing silicon oxide or silicon nitride on a front side of an etched silicon substrate of the wafer B-5 by using a PECVD process to obtain a wafer B-6, preferably, a thickness of the silicon oxide or silicon nitride being 0.5-5 μm;

S8. transferring a pattern of the heating wire from the lithography mask to the front side of the wafer B-6 by using the lithography process, then developing in the positive photoresist developer, and rinsing the surface with deionized water to obtain a wafer B-7, preferably, the lithography process being exposure in the hard contact mode of the ultraviolet lithography machine, the photoresist adopted in the lithography process being AZ5214E, the development time being 50 s, and more preferably, the exposure time being 15 s;

S9. evaporating a metal heating wire layer on the front side of the wafer B-7 by electron beam evaporation, then soaking the wafer B-7 in acetone with the front side up for peeling, and finally rinsing the wafer with deionized water to remove the photoresist and reserve the metal heating wire, so as to obtain a wafer B-8, preferably, the metal heating wire being made of metallic gold, platinum, palladium, rhodium, molybdenum, tungsten, platinum-rhodium alloy or non-metallic molybdenum carbide, and a thickness of the metal heating wire being 50 nm-500 nm;

S10. growing a silicon nitride or silicon oxide or aluminum oxide layer on the metal heating wire of the wafer B-8 by using the PECVD process as an insulating layer to obtain a wafer B-9, preferably, a thickness of the insulating layer being 30-150 nm;

S11. transferring a pattern of pores of the central window from the lithography mask to the front side of the wafer B-9 by using an ultraviolet laser direct writing lithography process, then developing in the positive photoresist developer, and rinsing the surface with deionized water to obtain a wafer B-10, preferably, photoresist adopted in the ultraviolet laser direct writing process being AZ5214E, and output power being 260 W/μs;

S12, etching silicon nitride or silicon oxide at the pores in the back side of the wafer B-10 by using the reactive ion etching process, then soaking the wafer B-10 in acetone with the front side up, and finally rinsing the wafer with acetone to remove the photoresist to obtain a wafer B-11, preferably, a size of the pores being 0.5 μm-5 μm; and S13. performing laser scribing on the wafer B-11 to obtain an independent chip, that is, the bottom chip; and performing assembling: performing assembling on the obtained top chip and bottom chip under a microscope, and aligning the central windows of the top chip and the bottom chip.

A thickness of an observed sample layer is determined by the thickness of the metal bonding layer of the present disclosure.

The heating wire in the center heating region of the heating layer is formed by winding spiral lines. The spiral lines are spaced, and adjacent spiral lines are disconnected from each other.

The sample injection ports are used for sample injection. If the size of the sample injection ports is too large, the sample injection ports may be too close to the central window, and thus may be difficult to seal. If the size of the sample injection ports is too small, sample injection may fail. The inventor of the present disclosure found that an optimal effect may be achieved when the size of the sample injection ports is 0.4*0.4 mm-0.8*0.8 mm, a distance from an edge of the central window is limited to 0.3-0.8 mm, and a distance from the outer edge of the chip is 0.3-0.5 mm.

In the present disclosure, the silicon nitride or silicon oxide support layer is used as a heating region substrate, and the silicon nitride or silicon oxide support layer is suspended on a silicon base frame to reduce the heat transfer effect of silicon and relieve serious sample drift caused by thermal expansion. In order to improve the uniformity of a plane thermal field in the heating region, the symmetrical spiral annular heating wire is designed to make the thermal field in the entire window region more uniform, which further relieves sample drift in the heating process.

In the present disclosure, a gas circulation system is introduced, and the gas inlet, the gas outlet and a cavity for gas diffusion in the middle are disposed. Gas flows in via the gas inlet, and is guided by the cavity to be first diffused to the window in the center heating region, and then diffused to the gas outlet, so that in-situ experiments with controllable gases are achieved.

The transmission electron microscope high-resolution in-situ gas phase heating chip includes the top chip and the bottom chip. The bottom chip is provided with the heating region with uniform thermal field distribution. The size of the bottom chip is preferably 4 mm*8 mm, and the size of the top chip is preferably 3.5 mm*6 mm. The top chip and the bottom chip are each formed by processing the silicon substrate, and silicon nitride or silicon oxide is grown on the two sides of the silicon substrate. Silicon nitride or silicon oxide films are used as a window film material, and may also be used as the insulating layer to isolate a semiconductor silicon base and a metal resistance wire.

The top chip is provided with the central window 1 after etching to the silicon nitride film on the front side, and the bottom chip is provided with the gas inlet, the gas outlet, the heating layer and the central window 2 after etching. Due to an etching angle of wet etching for silicon, if the size of the central window is too small, a pyramid-shaped pit is formed and etching ends when etching reaches a certain depth, and etching may not reach the front side; and if the size of the central window is too large, the silicon nitride film may crack. If a runner opening is too large, the flow direction of fluid cannot be controlled, resulting in difficulties in observation during an experiment. If the runner opening is too small, it may be difficult for liquid to flow in, and an experiment cannot be performed. Depending on thicknesses of different substrates, the size of the gas inlet or gas outlet is determined by allowing etching to end till the front side of the silicon substrate of the bottom chip such that the reserved silicon nitride or silicon oxide film window in the front side is not greater than 500 μm*500 μm and not smaller than 200 μm*200 μm. If the center region of the heating layer is too small, the center region may fail to cover the entire heating wire region, and if the center region of the heating layer is too large, the film window in the front side may be too large, which may cause cracks. Depending on thicknesses of different substrates, the size of the central window is determined by allowing etching to end till the front side of the substrate and the film window in the front side to be not greater than 100 μm*100 μm and not smaller than 5 μm*5 μm.

The heating wire of the heating layer may be metallic gold, platinum, palladium, rhodium, molybdenum, tungsten, platinum-rhodium alloy and non-metallic molybdenum carbide, etc. The outer diameter of the spiral annular heating wire of the heating layer is 0.15-0.5 mm, and the thickness thereof is 50 nm-500 nm. If the outer diameter of the spiral annular heating wire is too small, the heating power may be too small to reach a high temperature. If the outer diameter of the spiral annular heating wire is too large, a heating area of the silicon substrate may be increased, thermal expansion is aggravated, and sample drift is severe in the heating process. If the thickness of the heating wire is too large, processing time may be prolonged, and target material consumption and cost may be increased. If the thickness of the heating wire is too small, the resistance of the heating wire may be affected.

In the present disclosure, the central window is designed to be formed by the plurality of pores, and the diameter of the pores is 0.5 μm-5 μm. If the diameter of the pores is too small, an area of an observation region may be too small, thus limiting observation. If the diameter of the pores is too large, a thick window film is needed, which may greatly reduce the experimental resolution. The smaller the pores, the thinner the needed window film, and the thickness of the window film may reach 10 nm. The thinner the window film, the higher the resolution. Therefore, in the present disclosure, the plurality of pores are designed in the existing square window and a thinner window film is used in the pores in order to achieve a higher resolution. A shape of the pores is not limited, and may be a circle, an approximate circle, etc.

The heating layer is set as two equivalent circuits, and the two equivalent circuits are controlled by the separate current source meters and voltage source meters. One of the two equivalent circuits is used for supplying power to produce heat, and the other circuit is used for monitoring a resistance value of the heating wire after heating in real time. According to the relationship between resistance (R) and temperature (T) in a design program, the resistance of a test circuit is adjusted in real time through a feedback circuit to reach a set temperature.

The present disclosure aims to provide a transmission electron microscope high-resolution in-situ gas phase heating chip with high resolution, controllable liquid flow direction and low sample drift rate.

In order to achieve the above purpose, the present disclosure provides a transmission electron microscope high-resolution in-situ liquid phase heating chip. The transmission electron microscope high-resolution in-situ liquid phase heating chip structurally includes a top chip and a bottom chip combined via a metal bonding layer, the top chip and the bottom chip each including a front side and a back side, the front side of the top chip being directly bonded to the front side of the bottom chip via the metal bonding layer to be self-sealed to form an ultra-thin chamber, and the top chip and the bottom chip being each made of a silicon substrate with silicon nitride or silicon oxide on two sides.

The top chip is provided with two sample injection ports and a central window 1, the central window 1 is located in a center of the top chip, and the two sample injection ports are symmetrically disposed with respect to the central window 1;

the bottom chip is provided with a liquid inlet, a runner, a liquid outlet, a heating layer, a central window 2 and an insulating layer; the heating layer is provided with four contact electrodes and a spiral annular heating wire, the spiral annular heating wire is in a symmetrical shape, the heating wire is spaced and disconnected from each other, and the four contact electrodes are disposed at an edge of the chip; the heating wire in a center of the heating layer is disposed on the silicon substrate; in a region with the central window as a center and being larger than an outer edge of the spiral annular heating wire, silicon nitride or silicon oxide is disposed as a support film, silicon below the silicon nitride or silicon oxide support film is completely etched, and the silicon nitride or silicon oxide support film is reserved to be suspended on a position, in a heating wire center region of the heating layer, of the silicon substrate and other positions of the silicon substrate other than the heating wire center region; the position, in the heating wire center region of the heating layer, of the silicon substrate is separated from the positions of the silicon substrate other than the heating wire center region via the silicon nitride or silicon oxide support film; the liquid inlet and the liquid outlet are symmetrically disposed with respect to the central window 2, and communicate via the runner; the central window 2 is located in the center of the heating layer and is not shielded by a heating material; the insulating layer is disposed on the heating layer and covers the entire heating layer region except the four contact electrodes; and an area of the top chip is slightly smaller than an area of the bottom chip, the central windows of the top chip and the bottom chip are aligned, and a plurality of pores are provided in the central window 1 and the central window 2.

Further, an external dimension of the bottom chip is 2*2-10*10 mm; preferably, the external dimension of the bottom chip is 4*8 mm;

optionally, a thickness of the metal bonding layer is 50 nm-2000 nm, the metal bonding layer is made of low melting point metal; and preferably, the metal bonding layer is made of In, Sn or Al.

Further, a thickness of the silicon nitride or silicon oxide is 5-200 nm; and optionally, a thickness of the silicon substrate is 50-500 μm.

Further, the central window 1 and the central window 2 are square central windows; preferably, a size of the square central windows is 5 μm*5 μm-100 μm*100 μm; more preferably, the size of the square central windows is 20 μm*50 μm; and optionally, a size of the pores is 0.5 μm-5 μm.

Further, the heating layer is set as two equivalent circuits, the two equivalent circuits are controlled by separate current source meters and voltage source meters, one of the two equivalent circuits is used for supplying power to produce heat, and the other circuit is used for monitoring a resistance value of the heating wire after heating in real time.

Optionally, an outer diameter of the spiral annular heating wire of the heating layer is 0.15-0.5 mm, and a thickness thereof is 50 nm-500 nm; and optionally, the spiral annular heating wire is made of metallic gold, platinum, palladium, rhodium, molybdenum, tungsten, platinum-rhodium alloy or non-metallic molybdenum carbide.

Further, sizes of the liquid inlet and the liquid outlet are 200*200 μm-1000*1000 μm;

optionally, a width of a cross section of the runner is 10 μm-200 μm, and a height thereof is 50 nm-1 μm;

optionally, a width of the support film is 10-500 nm, and a thickness of the silicon nitride or silicon oxide used as the support film is 200 nm-5 μm; and optionally, a structure of the support film is an approximate circle or square with the central window as a center and having an inner diameter of 0.15 mm-0.5 mm.

Further, a preparation method of the top chip includes:

S1. transferring a pattern of the central window from a lithography mask to a front side of an Si(100) wafer A with silicon nitride or silicon oxide layers on two sides by using a lithography process, and then developing in a positive photoresist developer to obtain a wafer A-1, preferably, the lithography process being exposure in a hard contact mode of an ultraviolet lithography machine, photoresist adopted in the lithography process being AZ5214E, the development time being 50 s, a thickness of the wafer being 50-500 μm, a thickness of the silicon nitride or silicon oxide layers being 5-200 nm, and more preferably, the exposure time being 15 s;

S2. etching the silicon nitride layer on the front side of the wafer A-1 by using a reactive ion etching process to obtain the central window and the sample injection ports, then soaking the wafer in acetone with the front side up successively, and finally rinsing the wafer with a large amount of deionized water to remove the photoresist to obtain a wafer A-2;

S3. placing the wafer A-2 into a potassium hydroxide solution for wet etching with a back side up, ending etching until only a film window is reserved in the front side, taking out the wafer, and rinsing the wafer with a large amount of deionized water to obtain a wafer A-3, preferably, the mass percentage concentration of the potassium hydroxide solution being 20%, the etching temperature being 70-90° C., the etching time being 1-3 h, more preferably, the etching temperature being 80° C., and the etching time being 2 h;

S4. transferring a pattern of the bonding layer from the lithography mask to the front side of the wafer A-3 by using the lithography process, then developing in the positive photoresist developer, and rinsing a surface with deionized water to obtain a wafer A-4, the photoresist adopted being AZ5214E, preferably, the lithography process being exposure in the hard contact mode of the ultraviolet lithography machine, the photoresist adopted in the lithography process being AZ5214E, the development time being 50 s, and more preferably, the exposure time being 15 s;

S5. evaporating a metal bonding material on the wafer A-4 by using a thermal evaporation coating process to obtain a wafer A-5, preferably, a thickness of the metal bonding material being 50 nm-2000 nm, metal of the metal bonding material being low melting point metal, and more preferably, the metal of the metal bonding material being In, Sn or Al; and S6. performing laser scribing on the wafer A-5 to obtain an independent chip, that is, the top chip.

Further, a preparation method of the bottom chip includes:

S1. preparing an Si(100) wafer B with silicon nitride or silicon oxide layers on two sides, preferably, a thickness of the wafer being 50-500 μm, and a thickness of the silicon nitride or silicon oxide layers being 5-200 nm;

S2. transferring patterns of the central window, the liquid inlet and the liquid outlet from a lithography mask to a back side of the wafer in S1 by using a lithography process, then developing in a positive photoresist developer, and cleaning a surface with deionized water to obtain a wafer B-1, preferably, the lithography process being exposure in a hard contact mode of an ultraviolet lithography machine, photoresist adopted in the lithography process being AZ5214E, the development time being 65 s, and more preferably, the exposure time being 20 s;

S3, etching the silicon nitride layer on the back side of the wafer B-1 by using a reactive ion etching process to obtain the patterns of the central window, the liquid inlet and the liquid outlet, then soaking the wafer in acetone with the back side up successively, and finally rinsing the wafer with acetone to remove the photoresist to obtain a wafer B-2;

S4. placing the wafer B-2 into a potassium hydroxide solution for wet etching with the back side up, ending etching until exposed base silicon is completely etched, taking out the wafer, rinsing the wafer with a large amount of deionized water, and blowing the wafer dry to obtain a wafer B-3, preferably, the mass percentage concentration of the potassium hydroxide solution being 20%, the etching temperature being 70-90° C., the etching time being 1-3 h, more preferably, the etching temperature being 80° C., and the etching time being 2 h;

S5. transferring a pattern of a support film in an isolated section from the lithography mask to the back side of the wafer B-3 by using the lithography process, then developing in the positive photoresist developer, and rinsing the surface with deionized water to obtain a wafer B-4, preferably, the lithography process being exposure in the hard contact mode of the ultraviolet lithography machine, the photoresist adopted in the lithography process being AZ5214E, the development time being 50 s, and more preferably, the exposure time being 15 s;

S6, etching the silicon nitride layer on the back side of the wafer B-4 by using the reactive ion etching process to obtain the pattern of the support film in the isolated section, then soaking the wafer in acetone with the back side up successively, and finally rinsing the wafer with acetone to remove the photoresist to obtain a wafer B-5;

S7. placing the wafer B-5 into the potassium hydroxide solution for wet etching with the back side up, ending etching until exposed base silicon is completely etched, taking out the wafer, rinsing the wafer with a large amount of deionized water, and blowing the wafer dry to obtain a wafer B-6, preferably, the mass percentage concentration of the potassium hydroxide solution being 20%, the etching temperature being 70-90° C., the etching time being 1-3 h, more preferably, the etching temperature being 80° C., and the etching time being 2 h;

S8. growing a silicon nitride or silicon oxide layer with a thickness of 200 nm-5 μm at the support film by using a PECVD process to enhance mechanical strength, so as to obtain a wafer B-7, preferably, the thickness of silicon nitride or silicon oxide being 200 nm-5 μm;

S9. transferring a pattern of a heating wire from the lithography mask to the front side of the wafer B-7 by using the lithography process, then developing in the positive photoresist developer, and rinsing the surface with deionized water to obtain a wafer B-8, preferably, the lithography process being exposure in the hard contact mode of the ultraviolet lithography machine, the photoresist adopted in the lithography process being AZ5214E, the development time being 50 s, and more preferably, the exposure time being 15 s;

S10. evaporating a metal heating layer on the front side of the wafer B-8 by electron beam evaporation, then soaking the wafer in acetone with the front side up successively for peeling, and finally rinsing the wafer with deionized water to remove the photoresist and reserve a heating resistance layer, so as to obtain a wafer B-9, preferably, a thickness of the metal heating layer being 50 nm-500 nm, and more preferably, the metal heating layer being made of metallic gold, platinum, palladium, rhodium, molybdenum, tungsten, platinum-rhodium alloy or non-metallic molybdenum carbide;

S11. growing a silicon nitride or silicon oxide or aluminum oxide layer on the heating wire by using the PECVD process as the insulating layer to obtain a wafer B-10, preferably, a thickness of the insulating layer being 30-150 nm;

S12. transferring a pattern of the runner from the lithography mask to the front side of the wafer B-10 by using the lithography process, then developing in the positive photoresist developer, and rinsing the surface with deionized water to obtain a wafer B-11, preferably, the lithography process being exposure in the hard contact mode of the ultraviolet lithography machine, the photoresist adopted in the lithography process being AZ5214E, the development time being 50 s, and more preferably, the exposure time being 15 s;

S13. evaporating a non-precious metal material layer on the wafer B-11 by electron beam evaporation, then soaking the wafer in acetone with the front side up successively for peeling, and finally rinsing the wafer with deionized water to remove the photoresist and reserve a runner to obtain a wafer B-12, preferably, the non-precious metal material being Cr, Ti, Al, Zn or Cu, a width of the runner being 10 μm-200 μm, and a height thereof being 50 nm-1 μm;

S14. performing lithography on the central window in the front side of the wafer B-12 to obtain a pattern of pores by using a laser direct writing lithography process, then developing in the positive photoresist developer, and rinsing the surface with deionized water to obtain a wafer B-13, preferably, photoresist adopted in the laser direct writing lithography process being AZ5214E, output power being 260 W/μs, and the development time being 50 s;

S15, etching the silicon nitride layer on the front side of the wafer B-13 by using the reactive ion etching process to obtain the pattern of the pores, then soaking the wafer in acetone with the back side up successively, and finally rinsing the wafer with acetone to remove the photoresist to obtain a wafer B-14; and S16. performing laser scribing on the wafer B-14 to obtain an independent chip, that is, the bottom chip.

The present disclosure further provides a preparation method of the transmission electron microscope high-resolution in-situ liquid phase heating chip. The preparation method preparing a top chip:

S1. transferring a pattern of a central window from a lithography mask to a front side of an Si(100) wafer A with silicon nitride or silicon oxide layers on two sides by using a lithography process, and then developing in a positive photoresist developer to obtain a wafer A-1, preferably, the lithography process being exposure in a hard contact mode of an ultraviolet lithography machine, photoresist adopted in the lithography process being AZ5214E, the development time being 50 s, a thickness of the wafer being 50-500 μm, a thickness of the silicon nitride or silicon oxide layers being 5-200 nm, and more preferably, the exposure time being 15 s;

S2, etching the silicon nitride layer on the front side of the wafer A-1 by using a reactive ion etching process to obtain the central window and sample injection ports, then soaking the wafer in acetone with the front side up successively, and finally rinsing the wafer with a large amount of deionized water to remove the photoresist to obtain a wafer A-2;

S3. placing the wafer A-2 into a potassium hydroxide solution for wet etching with a back side up, ending etching until only a film window is reserved in the front side, taking out the wafer, and rinsing the wafer with a large amount of deionized water to obtain a wafer A-3, preferably, the mass percentage concentration of the potassium hydroxide solution being 20%, the etching temperature being 70-90° C., the etching time being 1-3 h, more preferably, the etching temperature being 80° C., and the etching time being 2 h;

S4. transferring a pattern of a bonding layer from the lithography mask to the front side of the wafer A-3 by using the lithography process, then developing in the positive photoresist developer, and rinsing a surface with deionized water to obtain a wafer A-4, the photoresist adopted being AZ5214E, preferably, the lithography process being exposure in the hard contact mode of the ultraviolet lithography machine, the photoresist adopted in the lithography process being AZ5214E, the development time being 50 s, and more preferably, the exposure time being 15 s;

S5. evaporating a metal bonding material on the wafer A-4 by using a thermal evaporation coating process to obtain a wafer A-5, preferably, a thickness of the metal bonding material being 50 nm-2000 nm, metal of the metal bonding material being low melting point metal, and more preferably, the metal of the metal bonding material being In, Sn or Al; and S6. performing laser scribing on the wafer A-5 to obtain an independent chip, that is, the top chip;

preparing a bottom chip:

S1. preparing an Si(100) wafer B with silicon nitride or silicon oxide layers on two sides, preferably, a thickness of the wafer being 50-500 μm, and a thickness of the silicon nitride or silicon oxide layers being 5-200 nm;

S2. transferring patterns of a central window, a liquid inlet and a liquid outlet from a lithography mask to a back side of the wafer in S1 by using a lithography process, then developing in a positive photoresist developer, and cleaning a surface with deionized water to obtain a wafer B-1, preferably, the lithography process being exposure in a hard contact mode of an ultraviolet lithography machine, photoresist adopted in the lithography process being AZ5214E, the development time being 65 s, and more preferably, the exposure time being 20 s;

S3, etching the silicon nitride layer on the back side of the wafer B-1 by using a reactive ion etching process to obtain the patterns of the central window, the liquid inlet and the liquid outlet, then soaking the wafer in acetone with the back side up successively, and finally rinsing the wafer with acetone to remove the photoresist to obtain a wafer B-2;

S4. placing the wafer B-2 into a potassium hydroxide solution for wet etching with the back side up, ending etching until exposed base silicon is completely etched, taking out the wafer, rinsing the wafer with a large amount of deionized water, and blowing the wafer dry to obtain a wafer B-3, preferably, the mass percentage concentration of the potassium hydroxide solution being 20%, the etching temperature being 70-90° C., the etching time being 1-3 h, more preferably, the etching temperature being 80° C., and the etching time being 2 h;

S5. transferring a pattern of a support film in an isolated section from the lithography mask to the back side of the wafer B-3 by using the lithography process, then developing in the positive photoresist developer, and rinsing the surface with deionized water to obtain a wafer B-4, preferably, the lithography process being exposure in the hard contact mode of the ultraviolet lithography machine, the photoresist adopted in the lithography process being AZ5214E, the development time being 50 s, and more preferably, the exposure time being 15 s;

S6, etching the silicon nitride layer on the back side of the wafer B-4 by using the reactive ion etching process to obtain the pattern of the support film in the isolated section, then soaking the wafer in acetone with the back side up successively, and finally rinsing the wafer with acetone to remove the photoresist to obtain a wafer B-5;

S7. placing the wafer B-5 into the potassium hydroxide solution for wet etching with the back side up, ending etching until exposed base silicon is completely etched, taking out the wafer, rinsing the wafer with a large amount of deionized water, and blowing the wafer dry to obtain a wafer B-6, preferably, the mass percentage concentration of the potassium hydroxide solution being 20%, the etching temperature being 70-90° C., the etching time being 1-3 h, more preferably, the etching temperature being 80° C., and the etching time being 2 h;

S8. growing a silicon nitride or silicon oxide layer with a thickness of 200 nm-5 μm at the support film by using a PECVD process to enhance mechanical strength, so as to obtain a wafer B-7, preferably, the thickness of silicon nitride or silicon oxide being 200 nm-5 μm;

S9. transferring a pattern of a heating wire from the lithography mask to the front side of the wafer B-7 by using the lithography process, then developing in the positive photoresist developer, and rinsing the surface with deionized water to obtain a wafer B-8, preferably, the lithography process being exposure in the hard contact mode of the ultraviolet lithography machine, the photoresist adopted in the lithography process being AZ5214E, the development time being 50 s, and more preferably, the exposure time being 15 s;

S10. evaporating a metal heating layer on the front side of the wafer B-8 by electron beam evaporation, then soaking the wafer in acetone with the front side up successively for peeling, and finally rinsing the wafer with deionized water to remove the photoresist and reserve a heating resistance layer, so as to obtain a wafer B-9, preferably, a thickness of the metal heating layer being 50 nm-500 nm, and more preferably, the metal heating layer being made of metallic gold, platinum, palladium, rhodium, molybdenum, tungsten, platinum-rhodium alloy or non-metallic molybdenum carbide;

S11. growing a silicon nitride or silicon oxide or aluminum oxide layer on the heating wire by using the PECVD process as an insulating layer to obtain a wafer B-10, preferably, a thickness of the insulating layer being 30-150 nm;

S12. transferring a pattern of a runner from the lithography mask to the front side of the wafer B-10 by using the lithography process, then developing in the positive photoresist developer, and rinsing the surface with deionized water to obtain a wafer B-11, preferably, the lithography process being exposure in the hard contact mode of the ultraviolet lithography machine, the photoresist adopted in the lithography process being AZ5214E, the development time being 50 s, and more preferably, the exposure time being 15 s;

S13. evaporating a non-precious metal material layer on the wafer B-11 by electron beam evaporation, then soaking the wafer in acetone with the front side up successively for peeling, and finally rinsing the wafer with deionized water to remove the photoresist and reserve a runner to obtain a wafer B-12, preferably, the non-precious metal material being Cr, Ti, Al, Zn or Cu, a width of the runner being 10 μm-200 μm, and a height thereof being 50 nm-1 μm;

S14. performing lithography on the central window in the front side of the wafer B-12 to obtain a pattern of pores by using a laser direct writing lithography process, then developing in the positive photoresist developer, and rinsing the surface with deionized water to obtain a wafer B-13, preferably, photoresist adopted in the laser direct writing lithography process being AZ5214E, output power being 260 W/μs, and the development time being 50 s;

S15, etching the silicon nitride layer on the front side of the wafer B-13 by using the reactive ion etching process to obtain the pattern of the pores, then soaking the wafer in acetone with the back side up successively, and finally rinsing the wafer with acetone to remove the photoresist to obtain a wafer B-14; and S16. performing laser scribing on the wafer B-14 to obtain an independent chip, that is, the bottom chip; and performing assembling: performing assembling on the obtained top chip and bottom chip under a microscope, and aligning the central windows of the top chip and the bottom chip.

In the bottom chip of the present disclosure: the position, in the heating wire center region of the heating layer, of the silicon substrate is separated from other regions of the silicon substrate except the heating wire center region of the heating layer by the silicon nitride or silicon oxide support film, is disposed in the center of the bottom chip in an isolated manner, and is disconnected from other regions of the silicon substrate.

A thickness of an observed sample layer is determined by the thickness of the metal bonding layer of the present disclosure.

The heating wire in the center heating region of the heating layer is formed by winding spiral lines. The spiral lines are spaced, and adjacent spiral lines are disconnected from each other.

The sample injection ports are used for sample injection. If the size of the sample injection ports is too large, the sample injection ports may be too close to the central window, and thus may be difficult to seal. If the size of the sample injection ports is too small, sample injection may fail. The inventor of the present disclosure found that an optimal effect may be achieved when the size of the sample injection ports is 0.4*0.4 mm-0.8*0.8 mm, a distance from an edge of the central window is limited to 0.3-0.8 mm, and a distance from the outer edge of the chip is 0.3-0.5 mm.

The present disclosure may introduce a nano-runner system. The nano-runner system is provided with the liquid inlet, the liquid outlet and a runner. Liquid flows in through the liquid inlet, and is guided through a runner cavity to first flow to the central window in the heating region and then flow to the liquid outlet, thus forming a cycle. By designing a directional runner shape, the diffusion direction of liquid is limited to achieve directional flowing. By controlling the width and height of the runner, a cross-sectional area of the runner is controlled to realize control over liquid flow. If the cross section of the runner is too small, liquid may fail to flow through due to large resistance. If the cross section of the runner is too large, the liquid direction may not be controlled accurately. A suitable width is 10 μm-200 μm, and a suitable height is 50 nm-1 μm. The experimental controllability is greatly enhanced by controlling the direction and flow of the liquid. The sizes of the liquid inlet and the liquid outlet are 200*200 μm-1000*1000 μm. If the sizes are too large, airtightness of the chip may be reduced.

In the present disclosure, the central window is designed to be formed by the plurality of pores. The smaller the pores, the thinner the needed window film, and the thickness of the window film may reach 10 nm. The thinner the center window film, the higher the resolution. Therefore, in the present disclosure, the plurality of pores are designed in the existing square window and a thinner window film is used in the pores in order to achieve a higher resolution. A shape of the pores is not limited, and may be a circle, an approximate circle, etc.

In the present disclosure, the heat transfer effect is blocked by isolating the silicon substrate in the heating resistance wire region from the silicon substrate of the whole chip via the silicon nitride or silicon oxide support film, thus reducing heat dissipation in the heating layer region, avoiding thermal expansion of the silicon substrate of the chip, and relieving sample drift in an electron microscopy test. In order to improve the uniformity of a plane thermal field of the heating layer, the symmetrical spiral annular heating wire is designed to make the thermal field in the entire window region more uniform, which further relieves sample drift in the heating process. The width of the support film is 10-500 nm. A smaller width may lead to incomplete corrosion, and a larger width may result in crack of the support film. In order to ensure the mechanical strength of the support film in the isolated section, a suitable thickness is 200 nm-5 μm. The silicon substrate in the heating layer region is still connected to the silicon substrate in other regions of the chip.

The bottom chip is provided with the heating layer with uniform thermal field distribution, the runner where liquid may flow, and the central window, and the size of the bottom chip is preferably 4 mm*8 mm. The top chip is provided with the sample injection ports and the central window, and the size of the top chip is preferably 3.5 mm*6 mm. The top chip and the bottom chip are each formed by processing the silicon substrate, and silicon nitride or silicon oxide is grown on the two sides of the silicon substrate. Silicon nitride or silicon oxide films are used as a film material for the central windows, and may also be used as the insulating layer to isolate a semiconductor silicon base and a metal resistance wire.

The top chip is provided with the square central window etched to the silicon nitride film on the front side, and the bottom chip is provided with the liquid inlet, the runner, the liquid outlet, the heating layer, and the central window after etching. Due to an etching angle of wet etching for silicon, if the square porous window is too small, a pyramid-shaped pit is formed and etching ends when etching reaches a certain depth, and etching may not reach the front side; and if the square porous window is too large, the silicon nitride film may crack.

The heating layer may be metallic gold, platinum, palladium, rhodium, molybdenum, tungsten, platinum-rhodium alloy and non-metallic molybdenum carbide, etc. The outer diameter of the spiral annular heating wire of the heating layer is 0.15-0.5 mm, and the thickness thereof is 50 nm-500 nm. If the outer diameter is smaller than 0.15 mm, the heating power may be too small to reach a high temperature. If the outer diameter is greater than 0.5 mm, a heating area of the silicon substrate may be increased, thermal expansion is aggravated, and sample drift is severe in the heating process. The thickness of the heating material is 50 nm-500 nm. The thickness range is moderate, and the heating material is neither too thick to prolong the processing time and increase target material consumption and cost, nor too thin to affect the resistance of the heating wire.

The heating layer is set as two equivalent circuits, and the two equivalent circuits are controlled by the separate current source meters and voltage source meters. One of the two equivalent circuits is used for supplying power to produce heat, and the other circuit is used for monitoring the resistance value of the heating wire after heating in real time. According to the relationship between resistance (R) and temperature (T) in a design program, the resistance of a test circuit is adjusted in real time through a feedback circuit to reach a set temperature.

The present disclosure aims to provide a transmission electron microscope in-situ electrothermal coupling chip with high resolution and low sample drift rate, such that the limitation of the single function of a traditional single-function in-situ chip is broken through, the multi-functional embodiment of electro-thermal coupling is achieved, and the application range of in-situ chips is extended.

In order to achieve the above purpose, the present disclosure provides a transmission electron microscope in-situ electrothermal coupling chip. The transmission electron microscope in-situ electrothermal coupling chip structurally includes a top chip and a bottom chip combined via a metal bonding layer, the top chip and the bottom chip each include a front side and a back side, the front side of the top chip is directly bonded to the front side of the bottom chip via the metal bonding layer to be self-sealed to form an ultra-thin chamber, and the top chip and the bottom chip are each made of a silicon substrate with silicon nitride or silicon oxide on two sides.

a structure of the top chip is, from the front side to the back side, a silicon nitride or silicon oxide layer 1, a silicon substrate, a silicon nitride or silicon oxide layer 1', a central window 1 is located in a center of the top chip, and penetrates through the silicon nitride or silicon oxide layer 1 on the front side and the silicon substrate, and two sample injection ports are disposed symmetrically with respect to the central window 1, and penetrate through the entire top chip;

a structure of the bottom chip is, from the front side to the back side, an electrode material layer, a transition layer, a silicon nitride or silicon oxide layer 2, a heating layer, an insulating layer, a silicon nitride or silicon oxide layer 3, a silicon substrate, and a silicon nitride or silicon oxide layer 3'; a central window 2 is located in a center of the bottom chip, and formed by etching the silicon substrate and the silicon nitride or silicon oxide layer 3' away to reserve the silicon nitride layer 3 on the front side; the heating layer is provided with four contact electrodes and an annular heating wire, the four contact electrodes are disposed at an edge of the chip, the heating wire is formed by connecting ends of a plurality of arc lines, slits are reserved at connecting positions of the arc lines, a working electrode of the electrode material layer is disposed at the slits, and a front end of the working electrode extends to the central window; and an area of the top chip is slightly smaller than an area of the, and the central windows of the top chip and the bottom chip are aligned.

Further, an external dimension of the bottom chip is 2*2 mm-10*10 mm;

preferably, the external dimension of the bottom chip is 4*8 mm;

optionally, a thickness of the metal bonding layer is 50 nm-2000 nm; the metal bonding layer is made of low melting point metal;

optionally, the metal bonding layer is made of In, Sn or Al;

optionally, a thickness of the silicon substrate is 50-500 μm; and optionally, thicknesses of the silicon nitride or silicon oxide layer 1, the silicon nitride or silicon oxide layer 1', the silicon nitride or silicon oxide layer 3, the silicon nitride or silicon oxide layer 3', and the silicon nitride or silicon oxide layer 2 are 5-200 nm.

Further, an outer diameter of the annular heating wire of the heating layer is 0.15-0.5 mm, and a thickness thereof is 50 nm-500 nm; and optionally, the heating layer is set as two equivalent circuits, the two equivalent circuits are controlled by separate current source meters and voltage source meters, one of the two equivalent circuits is used for supplying power to produce heat, and the other circuit is used for monitoring a resistance value of the heating wire after heating in real time.

Further, the central window 1 and the central window 2 are square central windows; preferably, a size of the square central windows is 5 μm*5 μm-100 μm*100 μm; more preferably, the size of the square central windows is 20 μm*50 μm; and Further, an electrode material of the electrode material layer is Au, Pt, Ti, Cu or amorphous C metal materials; a thickness of the electrode material layer is 30-200 nm;

optionally, the electrode material layer is provided with the working electrode, a counter electrode and a reference electrode, and the front end of the working electrode is located at the central window, and is opposite to a center of the counter electrode; preferably, a width of a narrowest point of the working electrode is 1-3 μm; the counter electrode adopts a semicircular arc pattern; preferably, the counter electrode adopts a semicircular pattern with a diameter of 200-700 μm; a distance between the counter electrode and the working electrode is 200-500 μm; and optionally, the transition layer is made of metal Cr, and a thickness of the transition layer is 3-10 nm.

Further, an outer diameter of the annular heating wire of the heating layer is 0.15-0.5 mm, and a thickness thereof is 50 nm-500 nm; and optionally, the annular heating wire is made of metallic gold, platinum, palladium, rhodium, molybdenum, tungsten, platinum-rhodium alloy or non-metallic molybdenum carbide; and optionally, the insulating layer is an aluminum oxide layer, and a thickness of the insulating layer is 50-300 nm.

Further, a preparation method of the top chip includes:

S1. preparing an Si(100) wafer A-1 with silicon nitride or silicon oxide layers on two sides, preferably, a thickness of the wafer A-1 being 50-500 μm, a thickness of the silicon nitride or silicon oxide layers being 5-200 nm, and more preferably, the thickness of the wafer A-1 being 200 μm;

S2. transferring a pattern of the sample injection ports from a lithography mask to a front side of the wafer A-1 by exposing in a hard contact mode of an ultraviolet lithography machine through a lithography process, and then developing in a positive photoresist developer to obtain a wafer A-2, preferably, the lithography process being exposure in the hard contact mode of the ultraviolet lithography machine, photoresist adopted in the lithography process being AZ5214E, the development time being 50 s, and more preferably, the exposure time being 15 s;

S3, etching a silicon nitride layer on the front side of the wafer A-2 by using a reactive ion etching process to obtain a liquid injection trough, then soaking the wafer A-2 in a cleaning agent with the front side up successively, and finally rinsing the wafer with a large amount of deionized water to remove the photoresist to obtain a wafer A-3;

S4. placing the wafer A-3 into a potassium hydroxide solution for wet etching with a back side up, ending etching until only a film window is reserved in the front side, taking out the wafer, and rinsing the wafer with a large amount of deionized water to obtain a wafer A-4, preferably, the mass percentage concentration of the potassium hydroxide solution being 20%, the etching temperature being 80° C., the etching time being 1.5-4 h, and more preferably, the etching time being 2 h;

S5. transferring a pattern of the central window from the lithography mask to the front side of the wafer A-4 by exposing in the hard contact mode of the ultraviolet lithography machine for 15 s through the lithography process, then developing in the positive photoresist developer for 50 s, and rinsing the surface with deionized water to obtain a wafer A-5, preferably, the lithography process being exposure in the hard contact mode of the ultraviolet lithography machine, the photoresist adopted in the lithography process being AZ5214E, the development time being 50 s, and more preferably, the exposure time being 15 s;

S6, etching the silicon nitride layer on the back side of the wafer A-5 by using the reactive ion etching process to obtain the central window, then soaking the wafer in a cleaning agent with the back side up successively, and finally rinsing the wafer with the cleaning agent to remove the photoresist to obtain a wafer A-6, preferably, the central window being located on a central axis of the wafer, a size of the central window being 5 μm*5 μm-100 μm*100 μm, and more preferably, the size of the central window being 20 μm*50 μm;

S7. placing the wafer A-6 into the potassium hydroxide solution for wet etching with the back side up, ending etching until only a film window is reserved in the front side, taking out the wafer, and rinsing the wafer with a large amount deionized water to obtain a wafer A-7, preferably, the mass percentage concentration of the potassium hydroxide solution being 20%, the etching temperature being 80° C., the etching time being 1.5-4 h, and more preferably, the etching time being 2 h;

S8. performing laser scribing on the wafer A-7 to obtain an independent chip, that is, the top chip.

Further, a preparation method of the bottom chip includes:

S1. preparing an Si(100) wafer B-1 with silicon nitride or silicon oxide layers on two sides, preferably, a thickness of the wafer B-1 being 50-500 μm, a thickness of the silicon nitride or silicon oxide layers being 5-200 nm, and more preferably, the thickness of the wafer B-1 being 200 μm;

S2. transferring a pattern of a central window from a lithography mask to a front side of the wafer B-1 by exposing in a hard contact mode of an ultraviolet lithography machine through a lithography process, then developing in a positive photoresist developer, and cleaning a surface with deionized water to obtain a wafer B-2, preferably, the lithography process being exposure in the hard contact mode of the ultraviolet lithography machine, photoresist adopted in the lithography process being AZ5214E, the development time being 65 s, and more preferably, the exposure time being 20 s;

S3, etching a silicon nitride layer on a back side of the wafer B-2 by using a reactive ion etching process to obtain the central window, then soaking the wafer in a cleaning agent with the back side up successively, and finally rinsing the wafer with the cleaning agent to remove the photoresist to obtain a wafer B-3;

S4. placing the wafer B-3 into a potassium hydroxide solution for wet etching with the back side up, ending etching until only a silicon nitride or silicon oxide layer film 2 at the central window is reserved on the front side, taking out the wafer, and rinsing the wafer with a large amount of deionized water to obtain a wafer B-4,
preferably, the mass percentage concentration of the potassium hydroxide solution being 20%, the etching temperature being 80° C., the etching time being 1.5-4 h, and a size of the central window is 20*50 μm;
S5. depositing aluminum oxide on the front side of the wafer B-4 except for the central window by atomic layer deposition as the insulating layer to obtain a wafer B-5,
preferably, a thickness of the aluminum oxide being 50-300 nm;
S6. transferring a pattern of the heating layer from the lithography mask to the front side of the wafer B-5 by exposing in the hard contact mode of the ultraviolet lithography machine through the lithography process, then developing in the positive photoresist developer, and rinsing the surface with deionized water to obtain a wafer B-6,
preferably, the lithography process being exposure in the hard contact mode of the ultraviolet lithography machine, the photoresist adopted in the lithography process being AZ5214E, the development time being 50 s, and
more preferably, the exposure time being 15 s;
S7. evaporating a film on the front side of the wafer B-6 by electron beam evaporation as the heating layer, then soaking the wafer in a cleaning agent with the front side up successively for peeling, and finally rinsing the wafer with deionized water to remove the photoresist and reserve the heating wire, so as to obtain a wafer B-7,
preferably, the heating layer being made of metal or a high melting point semiconductor material, a thickness of the heating layer being 50-500 nm, and
more preferably, the heating layer being made of metallic gold, platinum, palladium, rhodium, molybdenum, tungsten, platinum-rhodium alloy or non-metallic molybdenum carbide;
S8. depositing silicon oxide or silicon nitride on the front side of the wafer B-7 by using a PECVD process to obtain a wafer B-8,
preferably, a deposition thickness of the silicon oxide or silicon nitride being 5-200 nm;
S9. transferring an electrode pattern from the lithography mask to the front side of the wafer B-8 by exposing in the hard contact mode of the ultraviolet lithography machine through the lithography process, then developing in the positive photoresist developer, and cleaning the surface with deionized water to obtain a wafer B-9,
preferably, the lithography process being exposure in the hard contact mode of the ultraviolet lithography machine, the photoresist adopted in the lithography process being AZ5214E, the development time being 50 s, and
more preferably, the exposure time being 15 s;
S10. evaporating the transition layer and the electrode material on the front side of the wafer B-9 by electron beam evaporation, then soaking the wafer in acetone with the front side up successively for peeling, and finally rinsing the wafer with deionized water to remove the photoresist and reserve metal electrodes, so as to obtain a wafer B-10,
preferably, the transition layer being metal Cr, a thickness of the transition layer being 3-10 nm, the electrode material being Au, Pt, Ti, Cu and amorphous C metal materials, and a thickness of the electrode material being 30-200 nm; and
S11. performing laser scribing on the wafer B-10 to obtain an independent chip, that is, the bottom chip.
The present disclosure further provides a preparation method of the transmission electron microscope in-situ electrothermal coupling chip. The preparation method includes:
preparing a top chip:
S1. preparing an Si(100) wafer A-1 with silicon nitride or silicon oxide layers on two sides,
preferably, a thickness of the wafer A-1 being 50-500 μm, a thickness of the silicon nitride or silicon oxide layers being 5-200 nm, and
more preferably, the thickness of the wafer A-1 being 200 μm;
S2. transferring a pattern of sample injection ports from a lithography mask to a front side of the wafer A-1 by exposing in a hard contact mode of an ultraviolet lithography machine through a lithography process, and then developing in a positive photoresist developer to obtain a wafer A-2,
preferably, the lithography process being exposure in the hard contact mode of the ultraviolet lithography machine, photoresist adopted in the lithography process being AZ5214E, the development time being 50 s, and
more preferably, the exposure time being 15 s;
S3. etching a silicon nitride layer on the front side of the wafer A-2 by using a reactive ion etching process to obtain a liquid injection trough, then soaking the wafer A-2 in a cleaning agent with the front side up successively, and finally rinsing the wafer with a large amount of deionized water to remove the photoresist to obtain a wafer A-3;
S4. placing the wafer A-3 into a potassium hydroxide solution for wet etching with a back side up, ending etching until only a film window is reserved in the front side, taking out the wafer, and rinsing the wafer with a large amount of deionized water to obtain a wafer A-4,
preferably, the mass percentage concentration of the potassium hydroxide solution being 20%, the etching temperature being 80° C., the etching time being 1.5-4 h, and
more preferably, the etching time being 2 h;
S5. transferring a pattern of a central window from the lithography mask to the front side of the wafer A-4 by exposing in the hard contact mode of the ultraviolet lithography machine for 15 s through the lithography process, then developing in the positive photoresist developer for 50 s, and rinsing the surface with deionized water to obtain a wafer A-5,
preferably, the lithography process being exposure in the hard contact mode of the ultraviolet lithography machine, the photoresist adopted in the lithography process being AZ5214E, the development time being 50 s, and
more preferably, the exposure time being 15 s;
S6. etching the silicon nitride layer on the back side of the wafer A-5 by using the reactive ion etching process to obtain the central window, then soaking the wafer in a cleaning agent with the back side up successively, and finally rinsing the wafer with the cleaning agent to remove the photoresist to obtain a wafer A-6,
preferably, the central window being located on a central axis of the wafer, a size of the central window being 5 μm*5 μm-100 μm*100 μm, and more preferably, the size of the central window being 20 µm\*50 µm;

S7. placing the wafer A-6 into the potassium hydroxide solution for wet etching with the back side up, ending etching until only a film window is reserved in the front side, taking out the wafer, and rinsing the wafer with a large amount deionized water to obtain a wafer A-7, preferably, the mass percentage concentration of the potassium hydroxide solution being 20%, the etching temperature being 80° C., the etching time being 1.5-4 h, and more preferably, the etching time being 2 h;

S8. performing laser scribing on the wafer A-7 to obtain an independent chip, that is, the top chip;

preparing a bottom chip:

S1. preparing an Si(100) wafer B-1 with silicon nitride or silicon oxide layers on two sides, preferably, a thickness of the wafer B-1 being 50-500 µm, a thickness of the silicon nitride or silicon oxide layers being 5-200 nm, and more preferably, the thickness of the wafer B-1 being 200 µm;

S2. transferring a pattern of a central window from a lithography mask to a front side of the wafer B-1 by exposing in a hard contact mode of an ultraviolet lithography machine through a lithography process, then developing in a positive photoresist developer, and cleaning a surface with deionized water to obtain a wafer B-2, preferably, the lithography process being exposure in the hard contact mode of the ultraviolet lithography machine, photoresist adopted in the lithography process being AZ5214E, the development time being 65 s, and more preferably, the exposure time being 20 s;

S3, etching a silicon nitride layer on a back side of the wafer B-2 by using a reactive ion etching process to obtain the central window, then soaking the wafer in a cleaning agent with the back side up successively, and finally rinsing the wafer with the cleaning agent to remove the photoresist to obtain a wafer B-3;

S4. placing the wafer B-3 into a potassium hydroxide solution for wet etching with the back side up, ending etching until only a silicon nitride or silicon oxide layer film 2 at the central window is reserved on the front side, taking out the wafer, and rinsing the wafer with a large amount of deionized water to obtain a wafer B-4, preferably, the mass percentage concentration of the potassium hydroxide solution being 20%, the etching temperature being 80° C., the etching time being 1.5-4 h, and a size of the central window is 20\*50 µm;

S5. depositing aluminum oxide on the front side of the wafer B-4 except for the central window by atomic layer deposition as an insulating layer to obtain a wafer B-5, preferably, a thickness of the aluminum oxide being 50-300 nm;

S6. transferring a pattern of a heating layer from the lithography mask to the front side of the wafer B-5 by exposing in the hard contact mode of the ultraviolet lithography machine through the lithography process, then developing in the positive photoresist developer, and rinsing the surface with deionized water to obtain a wafer B-6, preferably, the lithography process being exposure in the hard contact mode of the ultraviolet lithography machine, the photoresist adopted in the lithography process being AZ5214E, the development time being 50 s, and more preferably, the exposure time being 15 s;

S7. evaporating a film on the front side of the wafer B-6 by electron beam evaporation as the heating layer, then soaking the wafer in a cleaning agent with the front side up successively for peeling, and finally rinsing the wafer with deionized water to remove the photoresist and reserve a heating wire, so as to obtain a wafer B-7, preferably, the heating layer being made of metal or a high melting point semiconductor material, a thickness of the heating layer being 50-500 nm, and more preferably, the heating layer being made of metallic gold, platinum, palladium, rhodium, molybdenum, tungsten, platinum-rhodium alloy or non-metallic molybdenum carbide;

S8. depositing silicon oxide or silicon nitride on the front side of the wafer B-7 by using a PECVD process to obtain a wafer B-8, preferably, a deposition thickness of the silicon oxide or silicon nitride being 5-200 nm;

S9. transferring an electrode pattern from the lithography mask to the front side of the wafer B-8 by exposing in the hard contact mode of the ultraviolet lithography machine through the lithography process, then developing in the positive photoresist developer, and cleaning the surface with deionized water to obtain a wafer B-9, preferably, the lithography process being exposure in the hard contact mode of the ultraviolet lithography machine, the photoresist adopted in the lithography process being AZ5214E, the development time being 50 s, and more preferably, the exposure time being 15 s;

S10. evaporating a transition layer and an electrode material on the front side of the wafer B-9 by electron beam evaporation, then soaking the wafer in acetone with the front side up successively for peeling, and finally rinsing the wafer with deionized water to remove the photoresist and reserve metal electrodes, so as to obtain a wafer B-10, preferably, the transition layer being metal Cr, a thickness of the transition layer being 3-10 nm, the electrode material being Au, Pt, Ti, Cu and amorphous C metal materials, and a thickness of the electrode material being 30-200 nm; and S11. performing laser scribing on the wafer B-10 to obtain an independent chip, that is, the bottom chip; and performing assembling: performing assembling on the obtained top chip and bottom chip under a microscope, and aligning the central windows of the top chip and the bottom chip.

The electrode material layer of the present disclosure includes the working electrode, the counter electrode and the reference electrode. The front end of the working electrode is located at the central window. The counter electrode is opposite to the working electrode, and is in a semi-circular arc shape. The front end of the working electrode is opposite to the center of the counter electrode, and a uniform electric field is formed on the working electrode after being energized.

A thickness of an observed sample layer is determined by the thickness of the metal bonding layer of the present disclosure.

The heating wire in the center heating region of the heating layer is formed by connecting ends of circular arc lines, and when the circular arc lines are connected, a space is reserved between adjacent circular arc lines to avoid mutual adhesion.

The transmission electron microscope in-situ electrothermal coupling chip includes the top chip and the bottom chip combined via the metal bonding layer, and specifically includes the silicon substrate with silicon nitride or silicon oxide layers on the two sides, the metal bonding layer, the electrode material layer, the transition layer, the silicon nitride or silicon oxide layers, the heating layer, the insulating layer, and the silicon substrate with the silicon nitride or silicon oxide layer on the two sides. The top chip and the bottom chip are provided with the central windows, and the central windows are located in the center of the heating layer and are not shielded by the heating material, such that the temperature of the entire window region may be uniform. The metal electrodes are also disposed on the insulating layer on the front side of the silicon substrate, and an electrochemical reaction occurs on the metal electrodes.

The present disclosure integrates heating and electrochemical functions, and can achieve thermoelectric coupling at the same time. The key point is that the heating wires and the electrochemical reaction electrodes are functionally coupled without being connected to each other, so as to cooperate but not interfere with each other. At the same time, it needs to be ensured that the central temperature is stable and the thermal field is uniform during heating of the heating layer. Thus, the pattern of the center of the heating layer is a circular arc annular heating wire which may wind as a circle or square. In order to ensure that the temperature of the center window is the highest and uniform, the heating layer winds annularly. A slit is reserved at the connecting position of the circular arc lines, the working electrode of the electrode layer is disposed at the slit, and the front end of the working electrode extends to the central window in the center of the heating layer, thus ensuring that the heating layer and the electrochemical electrodes are physically separated instead of being connected with each other after being energized.

The transmission electron microscope in-situ electrothermal coupling chip includes the top chip and the bottom chip which are each formed by processing the silicon substrate. The thickness of the silicon substrates is 50-500 μm, and ultra-thin silicon nitride or silicon oxide (with a thickness of 5-200 nm) grows on the two sides of the silicon substrates. The silicon nitride or silicon oxide films are used as a central window film material, and may also be used as the insulating layer to isolate the semiconductor silicon substrate and the metal resistance wire.

The top chip and the bottom chip are provided with the central windows (5 μm*5 μm-100 μm*100 μm, and more preferably 20 μm*50 μm) etched to the silicon nitride film on the front side. The top chip is further provided with the sample injection ports. Due to the etching angle of wet etching for silicon, if the square windows are too small, a pyramid-shaped pit is formed and etching ends when etching reaches a certain depth, and etching cannot reach the front side. If the sample injection ports are too large, the edges of the sample injection ports may be too close to the central window, liquid may overflow into the central window when injected, thus contaminating the central window.

In the three-electrode system, the reference electrode and the working electrode are located on one side, and the counter electrode is located on the other side. The front end of the working electrode is located at the central window, which is conductive to observing the electrochemical reaction on the working electrode. The width of the narrowest point of the working electrode is 1-3 μm. If the width is too large, the width may be greater than the width of the central window. If the width is too small, the lithography difficulty may be greatly increased. The counter electrode is opposite to the working electrode, and adopts the semi-circular arc pattern, and the front end of the working electrode is opposite to the center of the counter electrode. After electrification, a uniform electric field is formed at the front end of the working electrode in the central window, which is conducive to the electrochemical reaction at the window. The counter electrode adopts a semicircular pattern with a diameter of 200-700 μm, and the distance between the counter electrode and the working electrode is 200-500 μm.

The electrode material of the electrode material layer is Au, Pt, Ti, Cu, and amorphous C metal materials, and the thickness of the electrode material layer is 30-200 nm. The thickness range is moderate. If the metal electrode is too thick, the processing time may be prolonged, and the target material consumption and cost may be increased. If the metal electrode is too thin, the electrical conductivity of the metal electrodes may be affected.

The outer diameter of the circular arc annular heating wire of the heating layer is 0.15-0.5 mm, and the thickness thereof is 50 nm-500 nm. The thickness range is moderate. If the heating layer is too thick, the processing time may be prolonged, and the target material consumption and cost may be increased. If the heating layer is too thin, the resistance of the heating layer may be affected. The circular arc annular heating wire is made of metallic gold, platinum, palladium, rhodium, molybdenum, tungsten, platinum-rhodium alloy or non-metallic molybdenum carbide. If the outer diameter is smaller than 0.15 mm, the heat dissipation may be fast, and it is difficult to reach the set temperature. If the outer diameter is larger than 0.5 mm, the heated area of the silicon substrate may be extended, the thermal expansion may be aggravated, and sample drift is severe in the heating process.

The insulating layer is an aluminum oxide layer formed by atomic layer deposition on the silicon substrate. The thickness of the aluminum oxide layer is 50-80 nm. If the aluminum oxide layer is too thick, the processing time may be prolonged, and processing cost may be increased. If the aluminum oxide layer is too thin, the insulating effect during the electrochemical reaction may be affected.

The heating layer is set as two equivalent circuits, and the two equivalent circuits are controlled by the separate current source meters and voltage source meters. One of the two equivalent circuits is used for supplying power to produce heat, and the other circuit is used for monitoring the resistance value of the heating wire after heating in real time. According to the relationship between resistance (R) and temperature (T) in a design program, the resistance of a test circuit is adjusted in real time through a feedback circuit to reach a set temperature.

DESCRIPTION OF EMBODIMENTS

Figure 1:
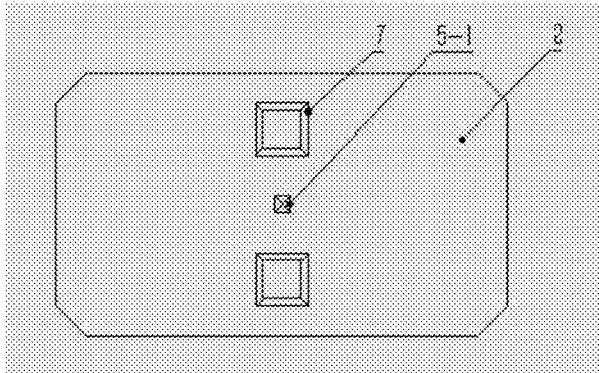
FIG. 1 is a schematic structural diagram of a front side of a top chip of a transmission electron microscope high-resolution in-situ gas phase heating chip.
Figure 2:
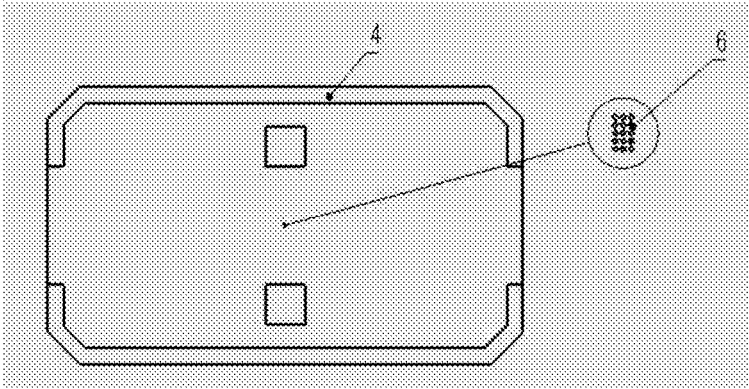
FIG. 2 is a schematic structural diagram of a back side of a top chip of a transmission electron microscope high-resolution in-situ gas phase heating chip.
Figure 3:
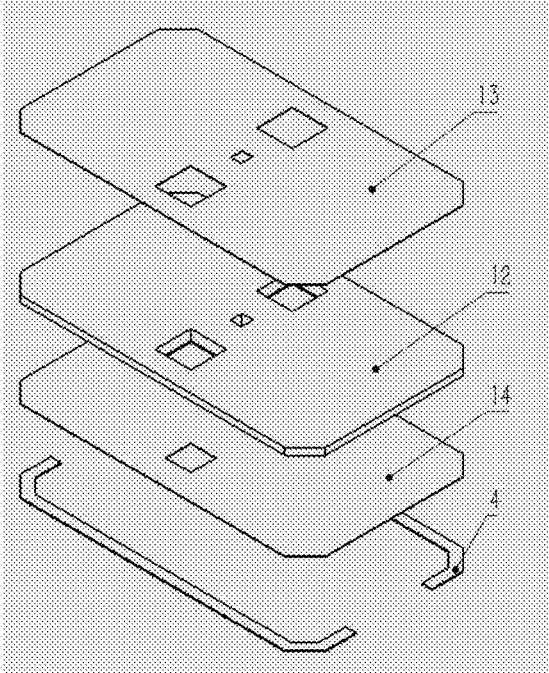
FIG. 3 is a schematic structural diagram of a top chip of a transmission electron microscope high-resolution in-situ gas phase heating chip.
Figure 4:
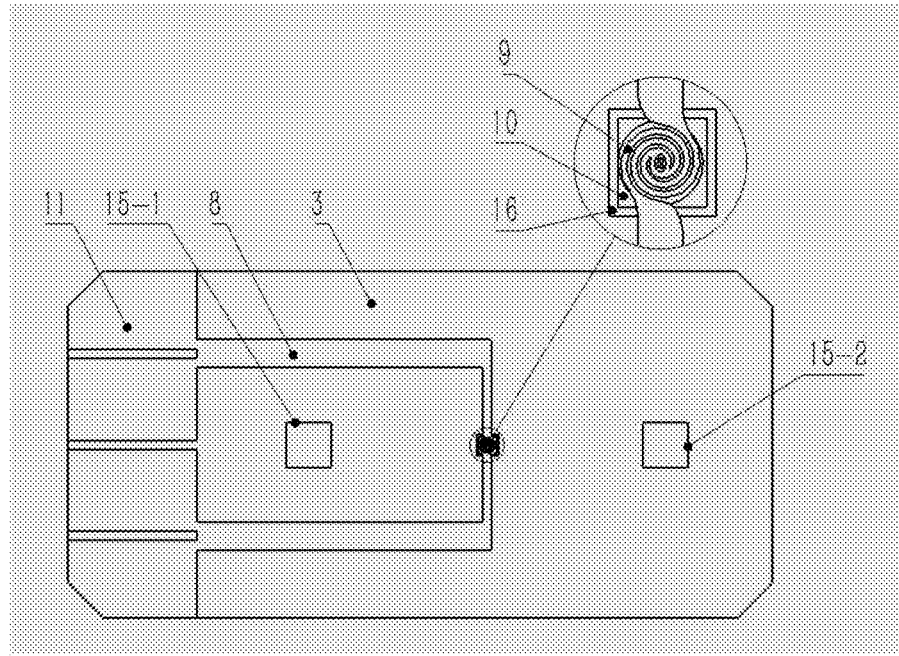
FIG. 4 is a schematic structural diagram of a front side of a bottom chip of a transmission electron microscope high-resolution in-situ gas phase heating chip.
Figure 5:
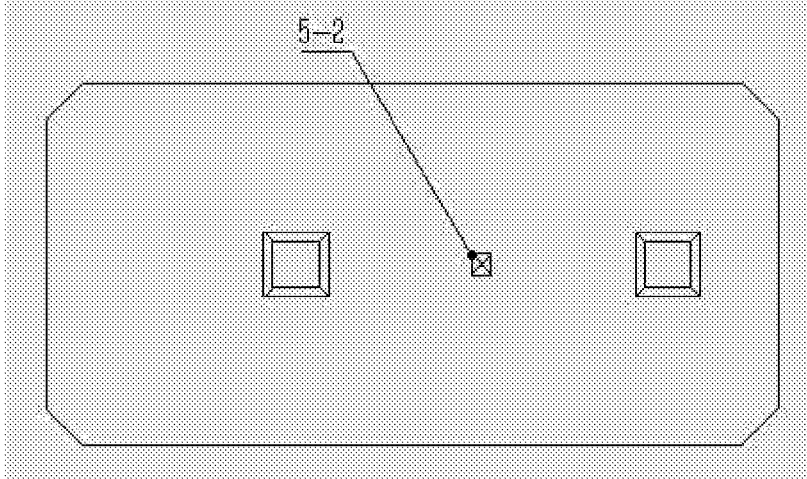
FIG. 5 is a schematic structural diagram of a back side of a bottom chip of a transmission electron microscope high-resolution in-situ gas phase heating chip.
Figure 6:
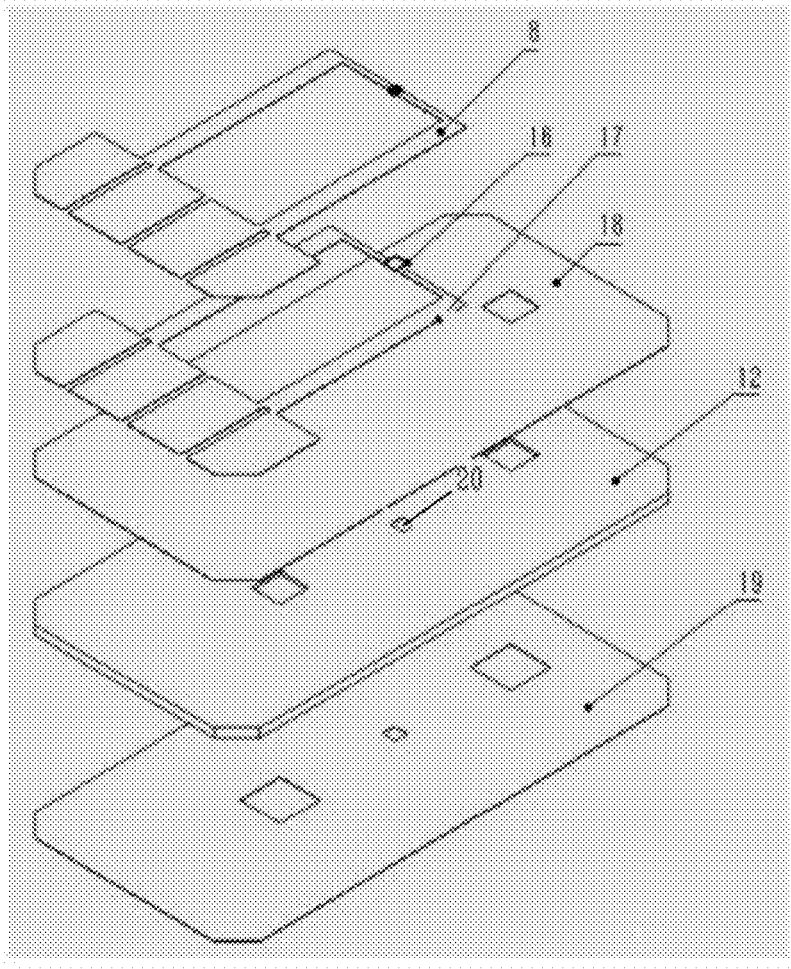
FIG. 6 is a schematic structural diagram of a bottom chip of a transmission electron microscope high-resolution in-situ gas phase heating chip.
Figure 7:
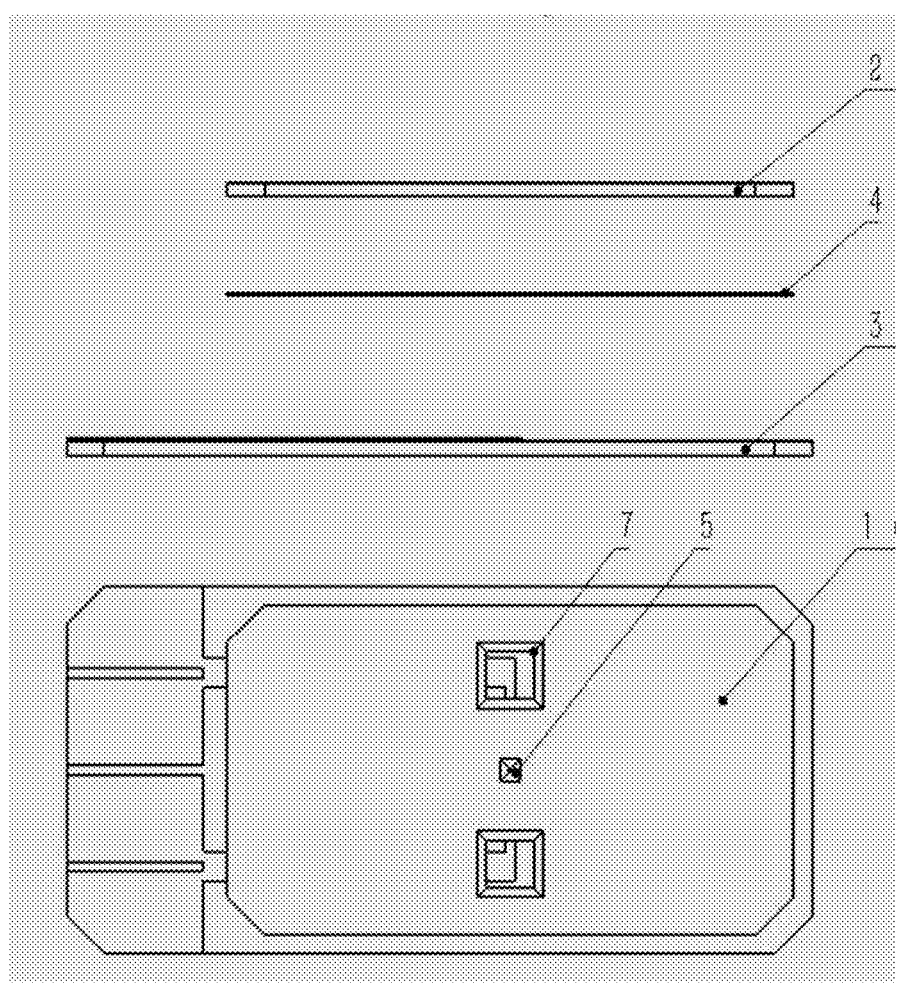
FIG. 7 is a schematic structural diagram of a transmission electron microscope high-resolution in-situ gas phase heating chip.
Figure 8:
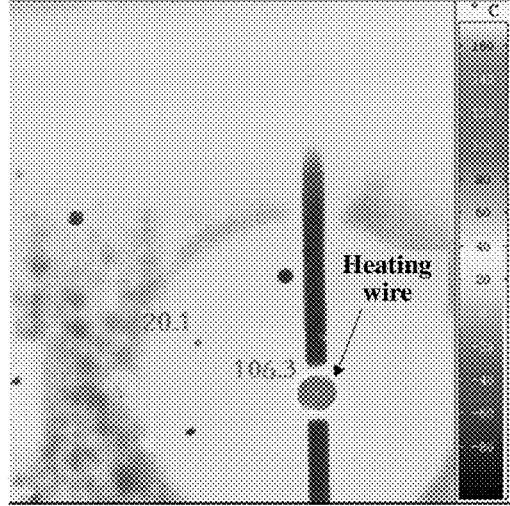
FIG. 8 is a diagram showing a result of infrared imaging temperature measurement after a transmission electron microscope high-resolution in-situ gas phase heating chip is energized.

The embodiments of the present disclosure will be described below in detail, examples of which are illustrated in the accompanying drawings. The same or similar reference numerals refer to the same or similar elements or elements having the same or similar functions throughout. The embodiments described below with reference to the accompanying drawings are exemplary, and are intended to be illustrative of the present disclosure and should not be construed as limiting the present disclosure. If no specific technology or condition is indicated in the examples, the technology or condition described in the literature in the field or a product specification is used. Reagents or instruments used without a manufacturer's indication are conventional products that can be obtained commercially.

DESCRIPTION OF REFERENCE NUMERALS

In FIG. 1 to FIG. 11, 1 denotes a transmission electron microscope high-resolution in-situ gas phase heating chip; 2 denotes a top chip; 3 denotes a bottom chip; 4 denotes a metal bonding layer; 5 denotes a central window; 5-1 denotes a central window of the top chip; 5-2 denotes a central window of the bottom chip; 6 denotes pores; 7 denotes sample injection ports; 8 denotes a heating layer; 9 denotes a heating wire; 10 denotes a heating wire center region; 11 denotes four contact electrodes; 12 denotes a silicon substrate; 13, 14, 18 and 19 denote silicon nitride or silicon oxide layers; 15-1 denotes a gas inlet; 15-2 denotes a gas outlet; 16 denotes a support layer; 17 denotes an insulating layer; and 20 denotes a hole.

In FIG. 22 to FIG. 29, 1 denotes a transmission electron microscope in-situ electrothermal coupling chip; 2 denotes a top chip; 3 denotes a bottom chip; 4 denotes a metal bonding layer; 5 denotes a central window; 5-1 denotes a central window of the top chip; 5-2 denotes a central window of the bottom chip; 7 denotes sample injection ports; 8 denotes a heating layer; 9 denotes a heating wire; 10 denotes a heating wire center region; 11 denotes four contact electrodes (for heating); 12 denotes a silicon substrate; 13 denotes a silicon nitride or silicon oxide layer 1; 14 denotes a silicon nitride or silicon oxide layer 1'; 15 denotes an electrode material layer; 15-1 denotes a working electrode; 15-2 denotes a reference electrode; 15-3 denotes a counter electrode; 16 denotes a transition layer; 17 denotes an insulating layer; 18 denotes a silicon nitride or silicon oxide layer 3; 19 denotes a silicon nitride or silicon oxide layer 3'; 20 denotes a silicon nitride or silicon oxide layer 2; 21 denotes slits; 22 denotes arc lines; and 15-1-1 denotes a front end of the working electrode.

In FIG. 22 to FIG. 29, 1 denotes a transmission electron microscope in-situ electrothermal coupling chip; 2 denotes a top chip; 3 denotes a bottom chip; 4 denotes a metal bonding layer; 5 denotes a central window; 5-1 denotes a central window of the top chip; 5-2 denotes a central window of the bottom chip; 7 denotes sample injection ports; 8 denotes a heating layer; 9 denotes a heating wire; 10 denotes a heating wire center region; 11 denotes four contact electrodes (for heating); 12 denotes a silicon substrate; 13 denotes a silicon nitride or silicon oxide layer 1; 14 denotes a silicon nitride or silicon oxide layer 1'; 15 denotes an electrode material layer; 15-1 denotes a working electrode; 15-2 denotes a reference electrode; 15-3 denotes a counter electrode; 16 denotes a transition layer; 17 denotes an insulating layer; 18 denotes a silicon nitride or silicon oxide layer 3; 19 denotes a silicon nitride or silicon oxide layer 3'; and 20 denotes a silicon nitride or silicon oxide layer 2.

Example 1: Preparation of a Transmission Electron Microscope High-Resolution In-Situ Gas Phase Heating Chip A bottom chip is prepared as follows according to the structures in FIG. 1 to FIG. 7, where 1 denotes the transmission electron microscope high-resolution in-situ gas phase heating chip; 2 denotes a top chip; 3 denotes the bottom chip; 4 denotes a metal bonding layer; 5 denotes a central window; 5-1 denotes a central window of the top chip; 5-2 denotes a central window of the bottom chip; 6 denotes pores; 7 denotes sample injection ports; 8 denotes a heating layer; 9 denotes a heating wire; 10 denotes a heating wire center region; 11 denotes four contact electrodes; 12 denotes a silicon substrate; 13, 14, 18 and 19 denote silicon nitride or silicon oxide layers; 15-1 denotes a gas inlet; 15-2 denotes a gas outlet; 16 denotes a support layer; 17 denotes an insulating layer; and 20 denotes a hole.

A bottom chip is prepared by:

(1) Preparing an Si(100) wafer (that is, a silicon substrate) B with silicon nitride or silicon oxide layers on two sides, a size of the wafer being 4 inches, a thickness of the wafer being preferably 200 μm, and a thickness of the silicon nitride or silicon oxide layers is 5-200 nm.

(2) Transferring patterns of a gas runner hole and a heating region carrier film from a lithography mask to a front side of the wafer B by exposing the wafer B in a hard contact mode of an ultraviolet lithography machine for 20 s through a lithography process, then developing in a positive photoresist developer for 65 s, and cleaning a surface with deionized water to obtain a wafer B-1, photoresist adopted being AZ5214E.

(3) Etching a silicon nitride layer on a back side of the wafer B-1 to obtain a central window, a gas inlet and a gas outlet in FIG. 1, and etching away silicon nitride or silicon oxide at a suspended heating region by using a reactive ion etching (RIE) process, then soaking the wafer in acetone with the back side up, and finally rinsing the wafer with acetone to remove the photoresist to obtain a wafer B-2.

(4) Placing the wafer B-2 into a potassium hydroxide solution with the mass percent concentration of 20% for wet etching with the back side up, performing the etching at the etching temperature of 80° C. for about 2 h until exposed base silicon is completely etched, taking out the wafer, rinsing the wafer with a large amount of deionized water, and blowing the wafer dry to obtain a wafer B-3. Due to an etching angle of wet etching for silicon, if the suspended heating region is too small, the suspended heating region may fail to cover the entire heating wire region, and if the suspended heating region is too large, a film window in the front side may be too large, which may cause cracks. Depending on thicknesses of different substrates, the size of the suspended heating region is determined by allowing etching to end till the front side of the substrate such that the film window in the front side is not greater than 500 μm*500 μm and not smaller than 150 μm*150 μm. If the suspended heating region is too large, film cracks may be caused, and if the suspended heating region is too small, the suspended heating region may fail to cover the entire heating resistance wire region.

(5) Transferring patterns of a gas inlet and a gas outlet from the lithography mask to the front side of the wafer B-3 by exposing the wafer B-3 spin-coated with photoresist in the hard contact mode of the ultraviolet lithography machine for 20 s through the lithography process, then developing in the positive photoresist developer for 65 s, and cleaning the surface with deionized water to obtain a wafer B-4, the photoresist adopted being AZ5214E.

(6) Etching a silicon nitride or silicon oxide film at the gas inlet and the gas outlet in the front side of the wafer B-4 away by using the reactive ion etching (RIE) process to form a hole allowing gas to pass through, then soaking the wafer in acetone with the front side up, and finally rinsing the wafer with acetone to remove the photoresist to obtain a wafer B-5.

(7) Growing silicon oxide/silicon nitride of 0.5-5 μm on the front side of the wafer B-5 by using a plasma enhanced chemical vapor deposition (PECVD) process to obtain a wafer B-6, such that the insulation property of the silicon substrate is enhanced, and a support film for the substrate at a heating region is thickened. If silicon oxide/silicon nitride is too thin, the strength of the support film is not high enough and may crack. If silicon oxide/silicon nitride is too thick, stress on the film may be so high that the film may wrinkle and cannot be used. After testing, the thickness of 0.5-5 μm is moderate, and no machine time is wasted.

(8) Transferring a pattern of a heating wire from the lithography mask to the front side of the wafer B-6 by exposing the wafer B-6 in the hard contact mode of the ultraviolet lithography machine for 15 s through the lithography process, then developing in the positive photoresist developer for 50 s, and rinsing the surface with deionized water to obtain a wafer B-7, photoresist adopted being AZ5214E.

(9) Evaporating the metal heating wire with a thickness of 50 nm-500 nm on the front side of the wafer B-7 by electron beam evaporation, then soaking the wafer in acetone with the front side up for peeling, and finally rinsing the wafer with deionized water to remove the photoresist and reserve a heating resistance layer, so as to obtain a wafer B-8, the metal heating wire being made of metallic gold, platinum, palladium, rhodium, molybdenum, tungsten, platinum-rhodium alloy and non-metallic molybdenum carbide, etc. If the heating wire is too thin, the heating wire is unstable at high temperature, and if the heating wire is too thick, the experimental cost may be high. The moderate thickness is 50 nm-500 nm.

(10) Growing a silicon nitride or silicon oxide layer with a thickness of 30-150 nm on the metal heating wire of the wafer B-8 by using the PECVD process as an insulating layer to obtain a wafer B-9.

(11) Transferring a pattern of pores of the central window from the lithography mask to the front side of the wafer B-9 by using an ultraviolet laser direct writing process, then developing in the positive photoresist developer for 50 s, and rinsing the surface with deionized water to obtain a wafer B-10, the photoresist adopted being AZ5214E.

(12) Etching silicon nitride at pores in the back side of the wafer B-10 by using the reactive ion etching (RIE) process until a thickness is 10 nm-15 nm, then soaking the wafer in acetone with the front side up, and finally rinsing the wafer with acetone to remove the photoresist to obtain a wafer B-11. The diameter of the pores is 0.5 μm-5 μm. If the diameter of the pores is too small, an area of an observation region may be too small, thus limiting observation. If the diameter of the pores is too large, a thick window film is needed, which may greatly reduce the experimental resolution.

(13) Performing laser scribing on the wafer B-11 to obtain an independent chip, that is, the bottom chip.

A top chip is prepared by:

(1) Transferring a pattern of a central window from a lithography mask to a front side of a silicon wafer A by exposing the wafer A with the front side spin-coated with photoresist in a hard contact mode of an ultraviolet lithography machine for 15 s through a lithography process, then developing in a positive photoresist developer for 50 s to obtain a wafer A-1, the photoresist adopted being AZ5214E. The wafer A is an Si(100) wafer (that is, a silicon substrate) with silicon nitride or silicon oxide layers on two sides, a size of the wafer is 4 inches, a thickness of the wafer is preferably 200 μm, and a thickness of the silicon nitride or silicon oxide layers is 5-200 nm.

(2) Etching a silicon nitride layer on the front side of the wafer A-1 by using a reactive ion etching (RIE) process to obtain the central window, then soaking the wafer in acetone with the front side up, and finally rinsing the wafer with a large amount of deionized water to remove the photoresist to obtain a wafer A-2.

(3) Transferring a pattern of pores of the central window from the lithography mask to the front side of the wafer A-2 by using an ultraviolet laser direct writing process, then developing in the positive photoresist developer for 50 s, and rinsing a surface with deionized water to obtain a wafer A-2, the photoresist adopted being AZ5214E.

(4) Etching silicon nitride at pores in a back side of the wafer A-2 by using the reactive ion etching (RIE) process until a thickness is 10 nm-15 nm, then soaking the wafer in acetone with the front side up successively, and finally rinsing the wafer with acetone to remove the photoresist to obtain a wafer A-3. The diameter of the pores is 0.5 μm-5 μm. If the diameter of the pores is too small, an area of an observation region may be too small, thus limiting observation. If the diameter of the pores is too large, a thick window film is needed, which may greatly reduce the experimental resolution.

(5) Placing the wafer A-3 into a potassium hydroxide solution with the mass percent concentration of 20% for wet etching with the back side up, performing the etching at the etching temperature of 80° C. for about 2 h until only a film window is reserved in the front side, taking out the wafer, and rinsing the wafer with a large amount of deionized water to obtain a wafer A-4.

(6) Transferring a pattern of a bonding layer from the lithography mask to the front side of the wafer A-4 by exposing the wafer A-4 in the hard contact mode of the ultraviolet lithography machine for 15 s through the lithography process, then developing in the positive photoresist developer for 50 s, and rinsing the surface with deionized water to obtain a wafer A-5, photoresist adopted being AZ5214E.

(7) Evaporating a metal bonding material with a thickness of 50 nm-200 nm on the wafer A-5 by using a thermal evaporation coating process to obtain a wafer A-6, the metal bonding material being made of In, Sn, Cu and other low melting point metals. If the bonding layer is too thick, the resolution may be reduced. If the bonding layer is too thin, the bonding capacity may be poor, the chip cannot be tightly bonded together, and the success rate may be reduced. The moderate thickness is 50 nm-200 nm.

(8) Performing laser scribing on the wafer A-6 to obtain an independent chip.

Assembling is performed:

Performing assembling on the top chip and the bottom chip under a microscope. The central windows of the top chip and the bottom chip are required to be aligned. If the central windows are skewed, the observation window may be too small to be found. If the central windows are not aligned, electron beams may fail to pass through.

Example 2

Four contact electrodes on the heating layer of the transmission electron microscope high-resolution in-situ gas phase heating chip obtained in Example 1 were communicated with an external temperature controller through wires, and the chip was energized for heating, and placed in front of a lens of an infrared thermal imager for thermal imaging temperature measurement. From a result shown in FIG. 8, it can be seen that when the chip is energized and heated up, the temperature of the heating wire center region rises to 106.3° C., while regions, away from the heating wire, of the silicon substrate are still at room temperature of 20.1° C., which indicates that heat transfer can be effectively isolated by disposing the heating wire on a suspended support layer, the silicon substrate is prevented from producing heat, and thus drift caused by thermal expansion can be effectively avoided.

Example 3

Figure 9:
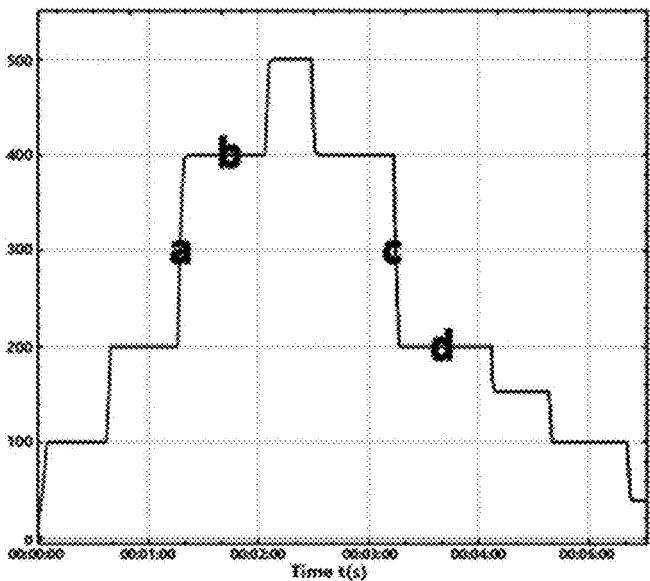
FIG. 9 is a diagram showing a result of a temperature rise and fall test after a transmission electron microscope high-resolution in-situ gas phase heating chip is energized.

Four contact electrodes on the heating layer of the transmission electron microscope high-resolution in-situ gas phase heating chip obtained in Example 1 were communicated with an external temperature controller through wires, and a program heating and cooling test is carried out. As shown in FIG. 9, sections a and c denote heating and rapid cooling stages, respectively, and the heating and cooling speeds are greater than 200° C./ms, which indicates that the heating chip can achieve rapid heating and cooling control. Sections b and c are temperature maintenance stages, in which a platform has no obvious fluctuation, and the temperature fluctuation is less than 0.1° C., which indicates that the chip has desirable temperature stability.

Example 4

Figure 10:
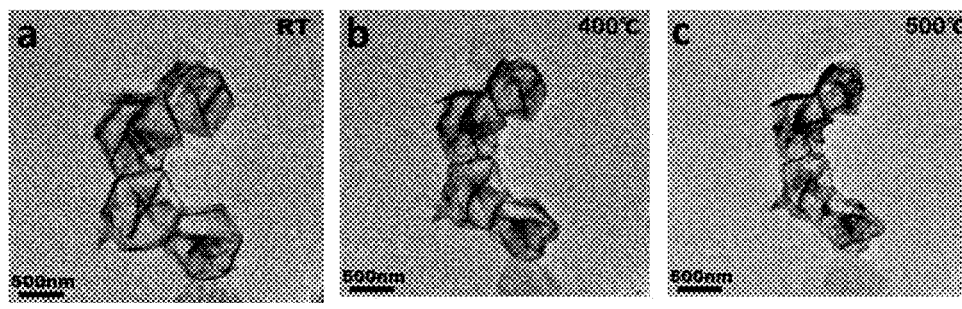
FIG. 10 is a diagram showing an electron microscope result after a cobalt hydroxide nanosheet sample is injected into a transmission electron microscope high-resolution in-situ gas phase heating chip.

A cobalt hydroxide nanosheet sample was injected into the central window through the sample injection ports of the transmission electron microscope high-resolution in-situ gas phase heating chip obtained in Example 1, and the chip is placed into a transmission electron microscope for observation after encapsulation, thus obtaining FIG. 10. FIG. 10 is transmission electron microscope (TEM) figures of a nanomaterial heated from room temperature to 400° C. and 500° C., and the sample collapses in structure. From the center position of the sample in figures a to c in FIG. 10, it can be seen that after the heating wire is heated up, pictures shot when the hexagonal lamellar sample is heated in the electron microscope are stable, and within the entire viewing range, the sample hardly drifts, which is conductive to observation.

Example 5

Figure 11:
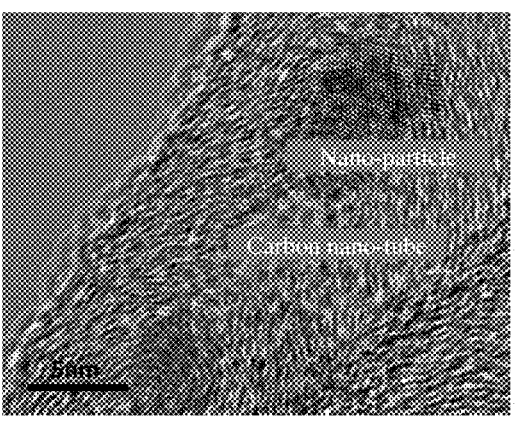
FIG. 11 is a diagram showing an electron microscope result after carbon-supported cobalt oxide nanoparticles are injected into a transmission electron microscope high-resolution in-situ gas phase heating chip.
Figure 12:
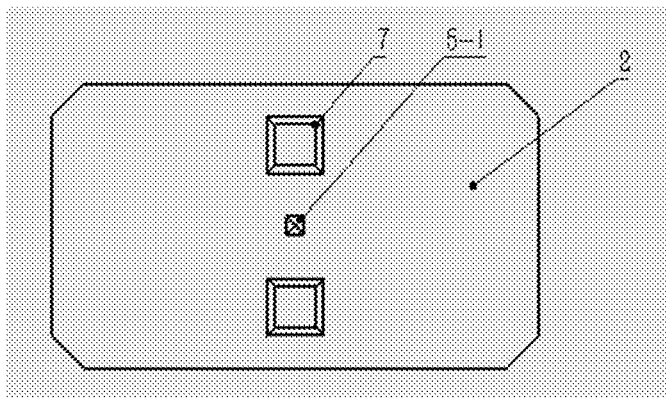
FIG. 12 is a schematic structural diagram of a front side of a top chip of a transmission electron microscope high-resolution in-situ liquid phase heating chip.
Figure 13:
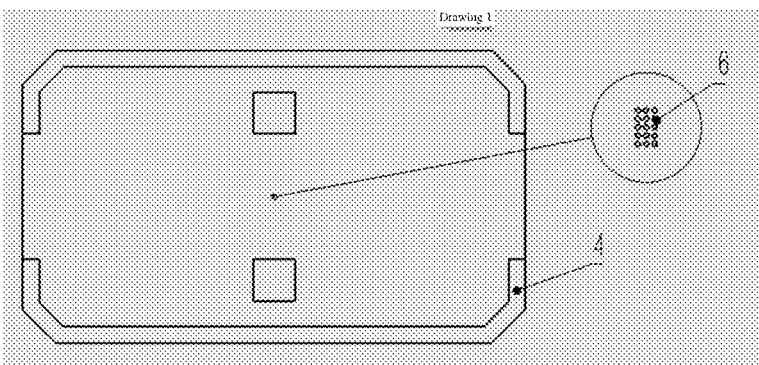
FIG. 13 is a schematic structural diagram of a back side of a top chip of a transmission electron microscope high-resolution in-situ liquid phase heating chip.
Figure 14:
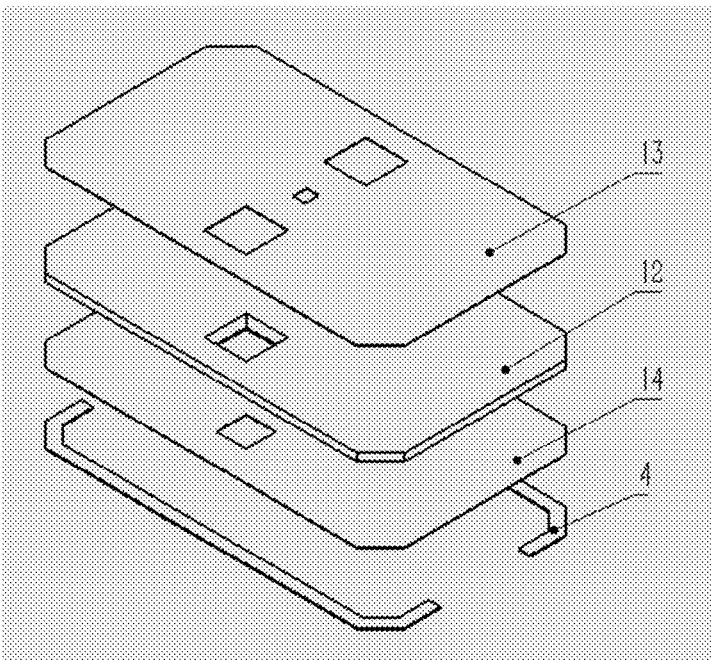
FIG. 14 is a schematic structural diagram of a top chip of a transmission electron microscope high-resolution in-situ liquid phase heating chip.
Figure 15:
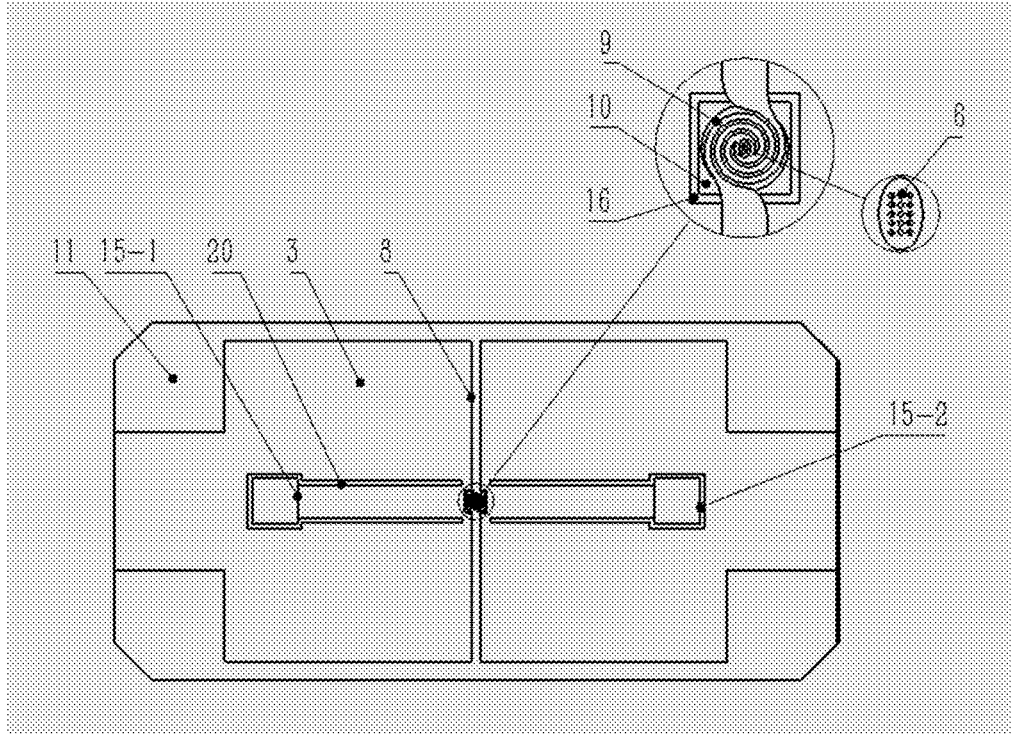
FIG. 15 is a schematic structural diagram of a front side of a bottom chip of a transmission electron microscope high-resolution in-situ liquid phase heating chip.
Figure 16:
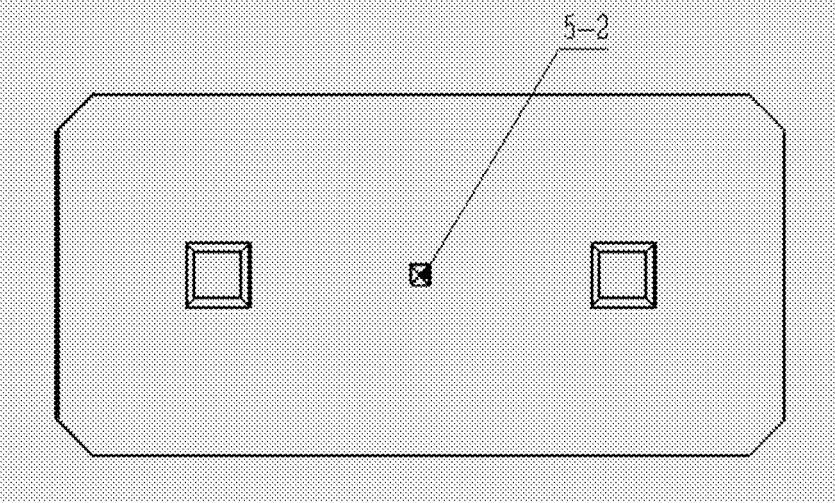
FIG. 16 is a schematic structural diagram of a back side of a bottom chip of a transmission electron microscope high-resolution in-situ liquid phase heating chip.
Figure 17:
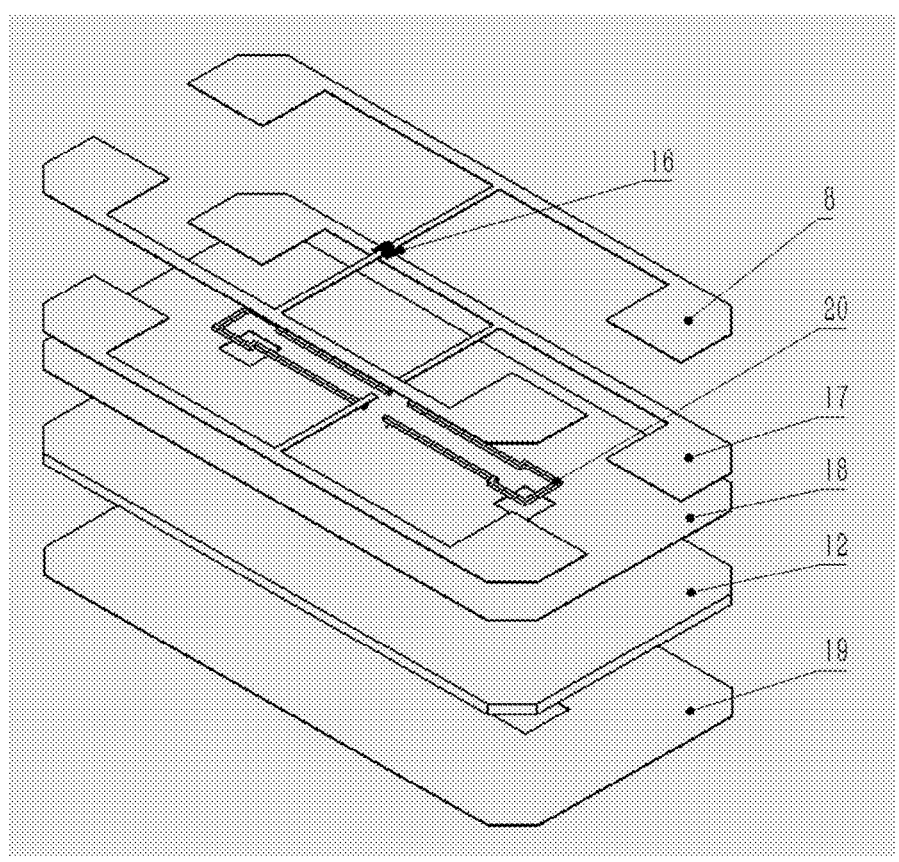
FIG. 17 is a schematic structural diagram of a bottom chip of a transmission electron microscope high-resolution in-situ liquid phase heating chip.
Figure 18:
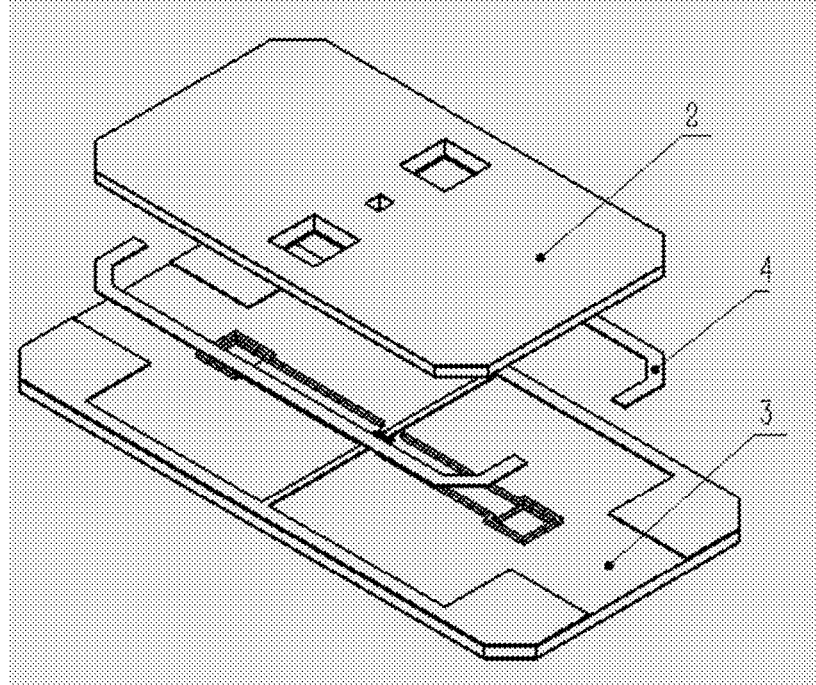
FIG. 18 is a schematic structural diagram of an appearance of a transmission electron microscope high-resolution in-situ liquid phase heating chip before a top chip and a bottom chip are combined.
Figure 19:
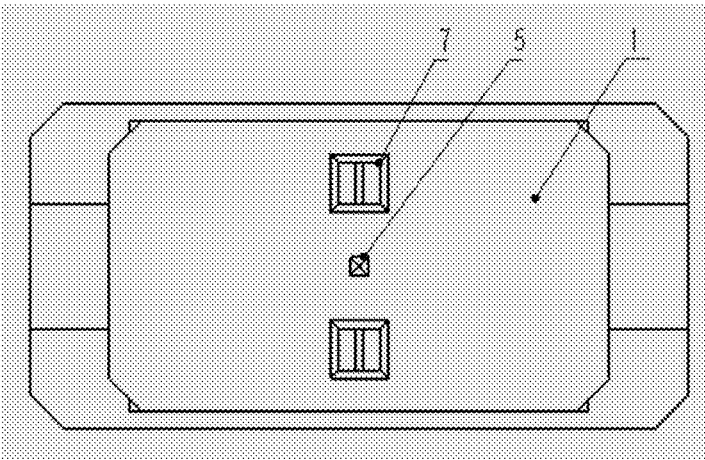
FIG. 19 is a schematic structural diagram of a transmission electron microscope high-resolution in-situ liquid phase heating chip.
Figure 20:
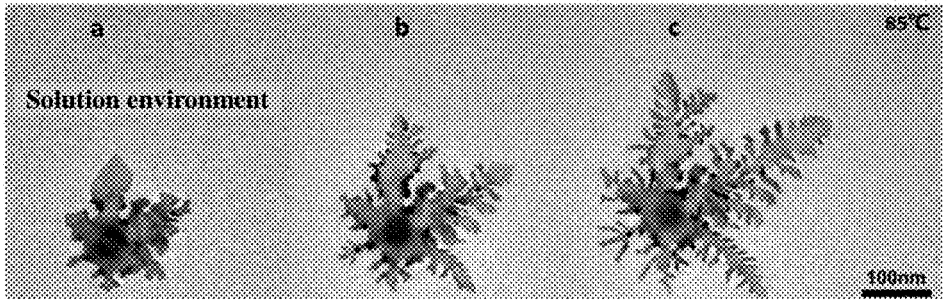
FIG. 20 is a diagram showing an electron microscope result after zinc sulfate solution particles with concentration of 0.05 mol/L are injected into a transmission electron microscope high-resolution in-situ liquid phase heating chip.
Figure 21:
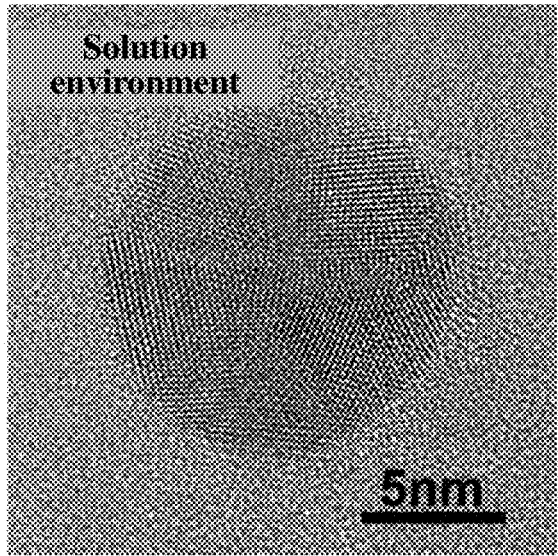
FIG. 21 is a diagram showing an electron microscope result after a colloidal solution of gold five-fold twinned nanoparticles is injected into a transmission electron microscope high-resolution in-situ liquid phase heating chip.
Figure 22:
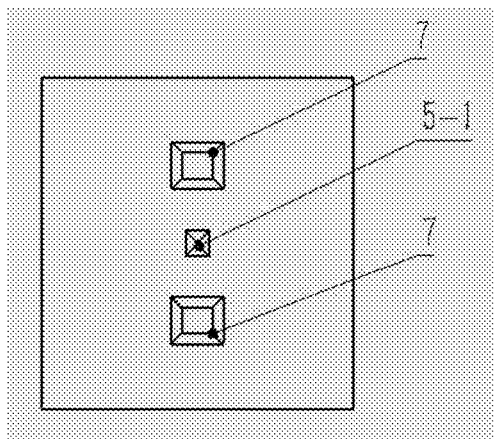
FIG. 22 is a schematic structural diagram of a front side of a top chip of a transmission electron microscope in-situ electrothermal coupling chip.
Figure 23:
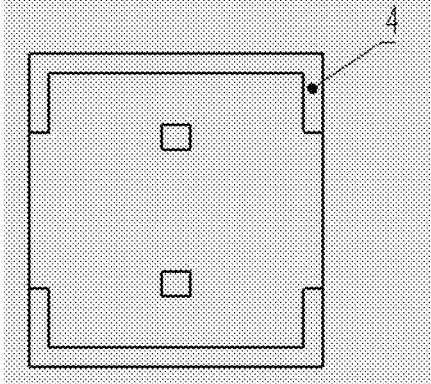
FIG. 23 is a schematic structural diagram of a back side of a top chip of a transmission electron microscope in-situ electrothermal coupling chip.
Figure 24:
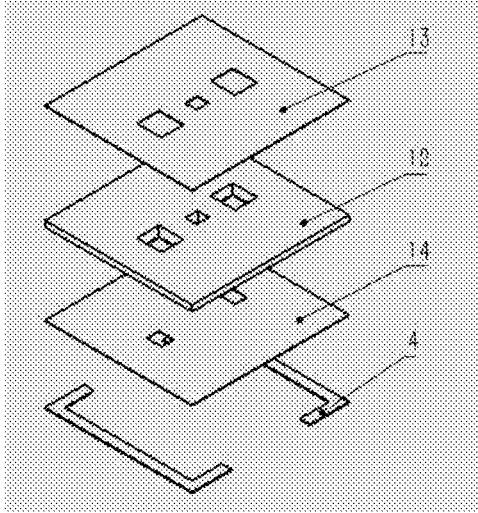
FIG. 24 is a schematic structural diagram of a top chip of a transmission electron microscope in-situ electrothermal coupling chip.
Figure 25:
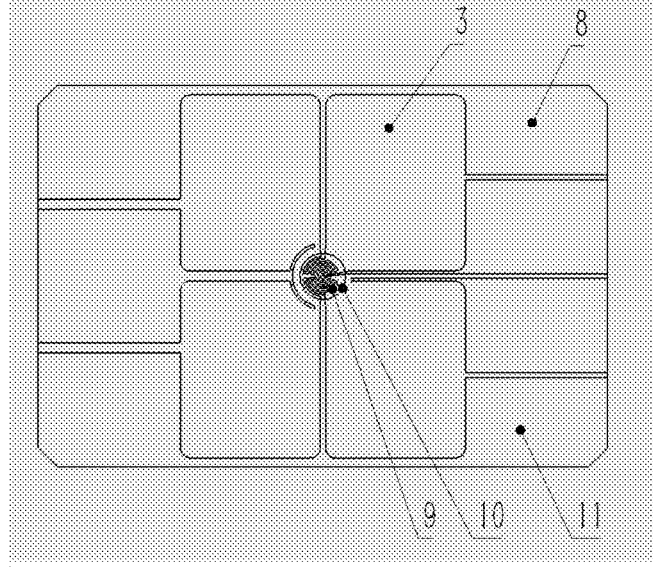
FIG. 25 is a schematic structural diagram of a front side of a bottom chip of a transmission electron microscope in-situ electrothermal coupling chip.
Figure 26:
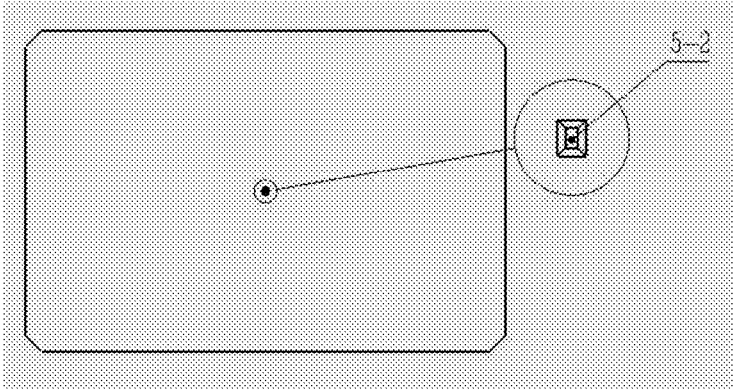
FIG. 26 is a schematic structural diagram of a back side of a bottom chip of a transmission electron microscope in-situ electrothermal coupling chip.
Figure 27:
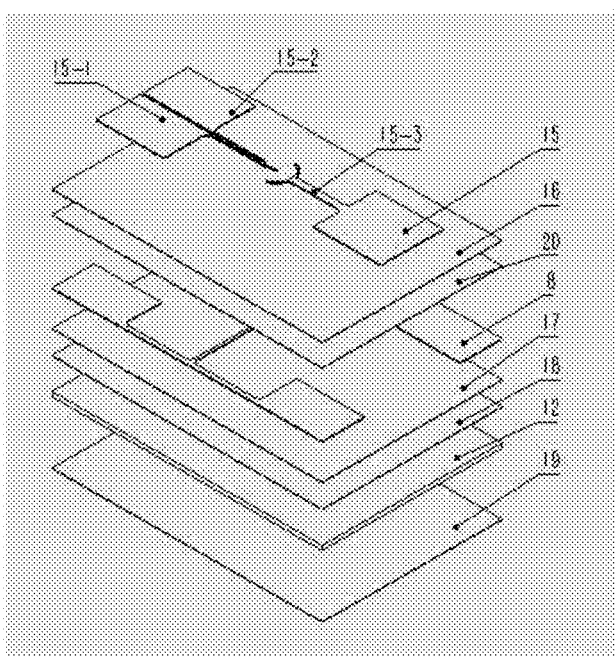
FIG. 27 is a schematic structural diagram of a bottom chip of a transmission electron microscope in-situ electrothermal coupling chip.
Figure 28:
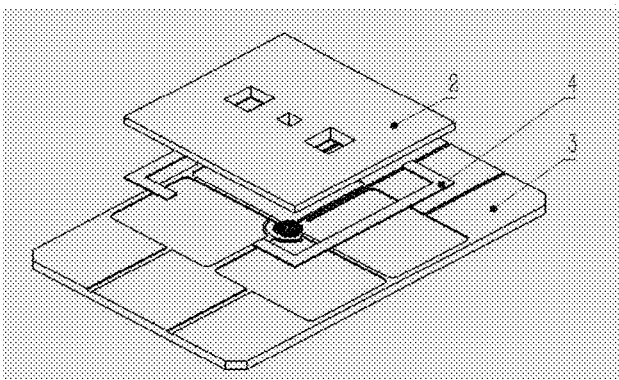
FIG. 28 is a schematic structural diagram of an appearance of a transmission electron microscope in-situ electrothermal coupling chip before a top chip and a bottom chip are combined.
Figure 29:
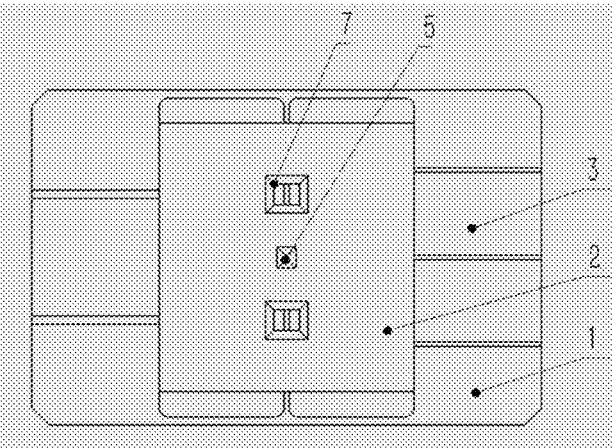
FIG. 29 is a schematic structural diagram of a transmission electron microscope in-situ electrothermal coupling chip.
Figure 30:
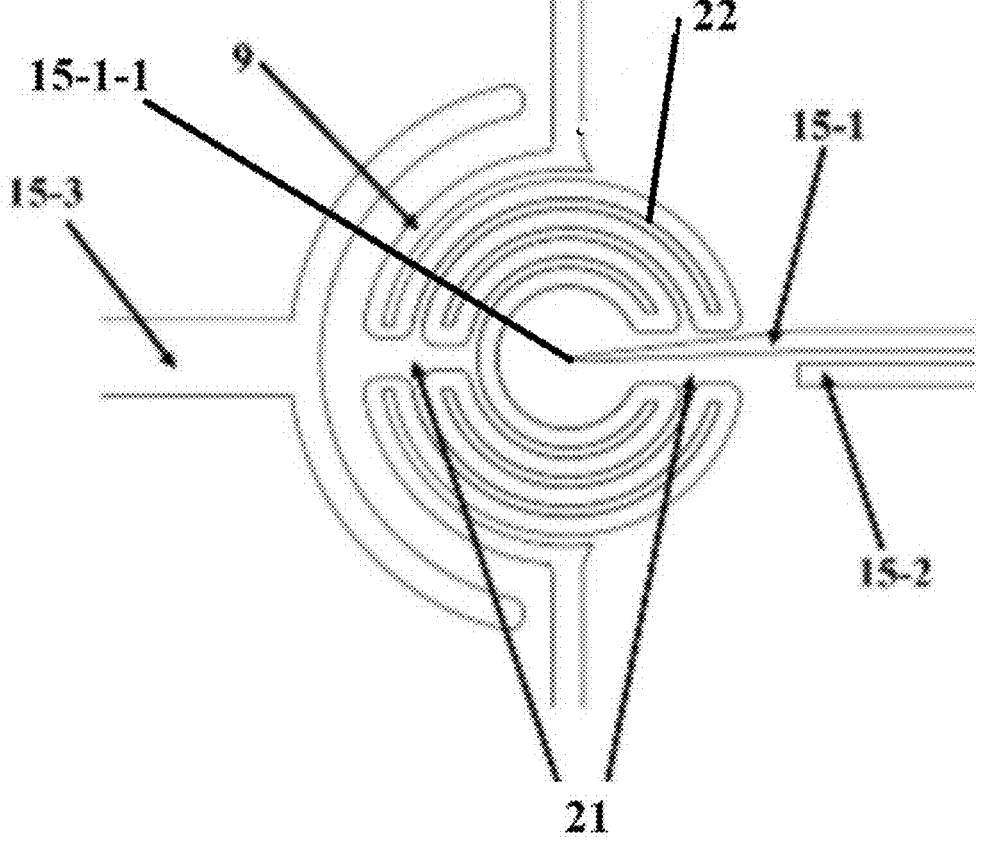
FIG. 30 is an enlarged view illustrating arrangements of a heating wire and an electrode material layer.

Carbon-supported cobalt oxide nanoparticles were injected into the central window via the sample injection ports of the transmission electron microscope high-resolution in-situ gas phase heating chip obtained in Example 1, and the chip is placed in the transmission electron microscope for observation after encapsulation, thus obtaining a cobalt oxide particle test chart. As shown in FIG. 11, two-dimensional lattice fringes of atomic structure arrangement of the nanoparticles may be clearly seen, which indicates that the imaging resolution of the chip can reach atomic-level.

Example 6: Preparation of a Transmission Electron Microscope High-Resolution In-Situ Liquid Phase Heating Chip The chip is prepared as follows according to the structures in FIG. 1 to FIG. 8, where reference numerals: 1 denotes a transmission electron microscope high-resolution in-situ liquid phase heating chip; 2 denotes a top chip; 3 denotes a bottom chip; 4 denotes a metal bonding layer; 5 denotes a central window; 5-1 denotes a central window of the top chip; 5-2 denotes a central window of the bottom chip; 6 denotes pores; 7 denotes sample injection ports; 8 denotes a heating layer; 9 denotes a heating wire; 10 denotes a heating wire center region; 11 denotes four contact electrodes (for heating); 12 denotes a silicon substrate; 13, 14, 18 and 19 denote silicon nitride or silicon oxide layers; 15-1 denotes a liquid inlet; 15-2 denotes a liquid outlet; 16 denotes a support layer; 17 denotes an insulating layer; and 20 denotes a runner.

A bottom chip is prepared by:

S1. Preparing an Si(100) wafer (that is, a silicon substrate) B with silicon nitride or silicon oxide layers on two sides, a size of the wafer being 4 inches, a thickness of the wafer being 100-200 μm, and a thickness of the silicon nitride or silicon oxide layers being 50-500 nm.

S2. Transferring patterns of a central window, a liquid inlet and a liquid outlet from a lithography mask to a back side of the wafer in S1 by exposing in a hard contact mode of an ultraviolet lithography machine for 20 s through a lithography process, then developing in a positive photoresist developer for 65 s, and cleaning a surface with deionized water to obtain a wafer B-1, photoresist adopted being AZ5214E.

S3. Etching a silicon nitride layer on the back side of the wafer B-1 by using a reactive ion etching (RIE) process to obtain the patterns of the central window, the liquid inlet and the liquid outlet, then soaking the wafer in acetone with the back side up successively, and finally rinsing the wafer with acetone to remove the photoresist to obtain a wafer B-2.

S4. Placing the wafer B-2 into a potassium hydroxide solution with the mass percent concentration of 20% for wet etching with the back side up, performing the etching at the etching temperature of 80° C. for about 2 h until exposed base silicon is completely etched, taking out the wafer, rinsing the wafer with a large amount of deionized water, and blowing the wafer dry to obtain a wafer B-3.

S5. Transferring a pattern of a support film in an isolated section from the lithography mask to the back side of the wafer B-3 by exposing in the hard contact mode of the ultraviolet lithography machine for 15 s through the lithography process, then developing in the positive photoresist developer for 50 s, and rinsing the surface with deionized water to obtain a wafer B-4, photoresist adopted being AZ5214E.

S6. Etching the silicon nitride layer on the back side of the wafer B-4 by using the reactive ion etching (RIE) process to obtain the pattern of the support film in the isolated section, then soaking the wafer in acetone with the back side up successively, and finally rinsing the wafer with acetone to remove the photoresist to obtain a wafer B-5.

S7. Placing the wafer B-5 into a potassium hydroxide solution with the mass percent concentration of 20% for wet etching with the back side up, performing the etching at the etching temperature of 80° C. for about 2 h until exposed base silicon is completely etched, taking out the wafer, rinsing the wafer with a large amount of deionized water, and blowing the wafer dry to obtain a wafer B-6.

S8. Growing a silicon nitride/silicon oxide layer with a thickness of 200 nm-5 μm at the support film in the isolated section of the wafer B-6 by using a PECVD process to enhance mechanical strength, so as to obtain a wafer B-7.

S9. Transferring a pattern of a heating wire from the lithography mask to the front side of the wafer B-7 by exposing in the hard contact mode of the ultraviolet lithography machine for 15 s through the lithography process, then developing in the positive photoresist developer for 50 s, and rinsing the surface with deionized water to obtain a wafer B-8, the photoresist adopted being AZ5214E.

S10. Evaporating a metal heating layer with a thickness of 50 nm-500 nm on the front side of the wafer B-8 by electron beam evaporation, then soaking the wafer in acetone with the front side up successively for peeling, and finally rinsing the wafer with deionized water to remove the photoresist and reserve a heating resistance layer, so as to obtain a wafer B-9, the metal heating layer being made of metallic gold, platinum, palladium, rhodium, molybdenum, tungsten, platinum-rhodium alloy and non-metallic molybdenum carbide, etc.

S11. Growing a silicon nitride/silicon oxide layer with a thickness of 30-150 nm on the heating wire of the wafer B-9 by using the PECVD process as an insulating layer to obtain a wafer B-10.

S12. Transferring a pattern of a runner from the lithography mask to the front side of the wafer B-10 by exposing in the hard contact mode of the ultraviolet lithography machine for 15 s through the lithography process, then developing in the positive photoresist developer for 50 s, and rinsing the surface with deionized water to obtain a wafer B-11, the photoresist adopted being AZ5214E.

S13. Evaporating a non-precious metal material (such as Cr, Ti, Al, Zn, Cu) layer with a thickness of 50 nm-500 nm on the wafer B-11 by electron beam evaporation as the runner, then soaking the wafer in acetone with the front side up successively for peeling, and finally rinsing the wafer with deionized water to remove the photoresist and reserve the runner to obtain a wafer B-12. A width of the runner is 10 μm-200 μm, and a height thereof is 50 nm-1 μm. If the height of the runner is too large, the resolution may be reduced. If the height of the runner is too small, it may be difficult for liquid to pass through.

S14. Performing lithography on the central window in the front side of the wafer B-12 to obtain a pattern of pores by using a laser direct writing lithography process, then developing in the positive photoresist developer, and rinsing the surface with deionized water to obtain a wafer B-13, preferably, photoresist adopted in the laser direct writing lithography process being AZ5214E, output power being 260 W/μs, and the development time being 50 s.

S15. Etching the silicon nitride layer on the front side of the wafer B-13 by using the reactive ion etching process to obtain the pattern of the pores, then soaking the wafer in acetone with the back side up successively, and finally rinsing the wafer with acetone to remove the photoresist to obtain a wafer B-14.

S16. Performing laser scribing on the wafer B-14 to obtain an independent chip, that is, the bottom chip.

A top chip is prepared by:

S1. Transferring a pattern of a central window from a lithography mask to a front side of an Si(100) wafer (that is, silicon substrate) A with silicon nitride or silicon oxide layers on two sides by exposing in a hard contact mode of an ultraviolet lithography machine for 15 s through a lithography process, and then developing in a positive photoresist developer for 50 s to obtain a wafer A-1, photoresist adopted being AZ5214E, a size of the wafer being 4 inches, a thickness of the wafer being 100-200 μm, and a thickness of the silicon nitride or silicon oxide layers being 50-500 nm.

S2. Etching a silicon nitride layer on the front side of the wafer A-1 by using a reactive ion etching (RIE) process to obtain the central window and sample injection ports, then soaking the wafer in acetone with the front side up successively, and finally rinsing the wafer with a large amount of deionized water to remove the photoresist to obtain a wafer A-2.

S3. Placing the wafer A-2 into a potassium hydroxide solution with the mass percent concentration of 20% for wet etching with the back side up, performing the etching at the etching temperature of 80° C. for about 2 h until only a film window is reserved in the front side, taking out the wafer, and rinsing the wafer with a large amount of deionized water to obtain a wafer A-3.

S4. Transferring a pattern of a bonding layer from the lithography mask to the front side of the wafer A-3 by exposing in the hard contact mode of the ultraviolet lithography machine for 15 s through the lithography process, then developing in the positive photoresist developer for 50 s, and rinsing the surface with deionized water to obtain a wafer A-4, the photoresist adopted being AZ5214E.

S5. Evaporating a metal bonding material with a thickness of 50 nm-200 nm on the wafer A-4 by using a thermal evaporation coating process to obtain a wafer A-5, the metal bonding material being made of In, Sn, Cu and other low melting point metals. If the bonding layer is too thick, the resolution may be reduced. If the bonding layer is too thin, the bonding capacity may be poor, the chip cannot be tightly bonded together, and the success rate may be reduced. The moderate thickness is 50 nm-200 nm.

S6. Performing laser scribing on the wafer A-5 to obtain an independent chip, that is, the top chip.

Assembling is performed:

Performing assembling on the top chip and the bottom chip under a microscope. The central windows of the top chip and the bottom chip are required to be aligned. If the central windows are skewed, the observation window may be too small to be found. If the central windows are not aligned, electron beams may fail to pass through.

Example 7

Four contact electrodes on the heating layer of the transmission electron microscope high-resolution in-situ liquid phase heating chip obtained in Example 6 were communicated with an external temperature controller through wires, and the chip was energized for heating, and placed in front of a lens of an infrared thermal imager for thermal imaging temperature measurement. It is found that when the chip is energized and heated up, the temperature of the heating wire center region rises to 100° C., while regions, away from the heating wire, of the silicon substrate are still at room temperature of 20.1° C., which indicates that heat transfer can be effectively isolated by disposing the heating wire on a suspended support layer, the silicon substrate is prevented from producing heat, and thus drift caused by thermal expansion can be effectively avoided.

The four contact electrodes on the heating layer of the transmission electron microscope high-resolution in-situ liquid phase heating chip obtained in Example 6 were communicated with the external temperature controller through the wires, a program heating and cooling test is carried out, and it is found that the heating and cooling speed is greater than 200° C./ms, which indicates that the heating chip may achieve rapid heating and cooling control. In temperature maintenance stages, a platform has no obvious fluctuation, and the temperature fluctuation is less than 0.1° C., which indicates that the chip has desirable temperature stability.

Example 8

Zinc sulfate solution particles with the concentration of 0.05 mol/L were injected into the central window via sample injection ports and the runner of the transmission electron microscope high-resolution in-situ liquid phase heating chip obtained in Example 6, the chip is placed to a transmission electron microscope to be observed after encapsulation, the chip is energized and heated up to 85° C., and a magnification factor is 700,000 times. Results are shown in FIG. 9. a, b, and c are electron microscope results at different times, with a difference of about 2 minutes. It can be seen that there is no obvious drift of the nanoparticles, the nanoparticles grow under heating conditions, and almost no obvious drift occurs in the growth process, which indicates that the chip has desirable stability and low thermal drift rate in the heating process. At the same time, the morphology and outline of the nanoparticles are clear, which indicates that the chip has a high resolution.

Example 9

A colloidal solution of five-fold twinned gold nanoparticles was injected into the central window via the sample injection ports of the transmission electron microscope high-resolution in-situ liquid phase heating chip obtained in Example 6, the chip is placed in a transmission electron microscope to be observed after encapsulation, and a magnification factor is 1M times, thus obtaining a five-fold twinned high-resolution diagram. As shown in FIG. 10, two-dimensional lattice fringes of atomic structure arrangement of the nanoparticles may be clearly seen, which indicates that the imaging resolution of the chip may reach atomic-level.

Example 10: Preparation of a Transmission
Electron Microscope In-Situ Electrothermal
Coupling Chip The chip is prepared as follows according to the structures in FIG. 1 to FIG. 8, where 1 denotes a transmission electron microscope in-situ electrothermal coupling chip; 2 denotes a top chip; 3 denotes a bottom chip; 4 denotes a metal bonding layer; 5 denotes a central window; 5-1 denotes a central window of the top chip; 5-2 denotes a central window of the bottom chip; 7 denotes sample injection ports; 8 denotes a heating layer; 9 denotes a heating wire; 10 denotes a heating wire center region; 11 denotes four contact electrodes (for heating); 12 denotes a silicon substrate; 13 denotes a silicon nitride or silicon oxide layer 1; 14 denotes a silicon nitride or silicon oxide layer 1'; 15 denotes an electrode material layer; 15-1 denotes a working electrode; 15-2 denotes a reference electrode; 15-3 denotes a counter electrode; 16 denotes a transition layer; 17 denotes an insulating layer; 18 denotes a silicon nitride or silicon oxide layer 3; 19 denotes a silicon nitride or silicon oxide layer 3'; and 20 denotes a silicon nitride or silicon oxide layer 2.

A top chip is prepared by:

S1. Preparing an Si(100) wafer (that is, a silicon substrate) A-1 with silicon nitride or silicon oxide layers on two sides, a size of the wafer being 4 inches, a thickness of the wafer being 50-500 μm, and a thickness of the silicon nitride or silicon oxide layers being 5-200 nm.

S2. Transferring a pattern of sample injection ports from a lithography mask to a front side of the wafer A-1 by exposing in a hard contact mode of an ultraviolet lithography machine for 15 s through a lithography process, then developing in a positive photoresist developer for 50 s, and rinsing the wafer with a large amount of deionized water to obtain a wafer A-2, photoresist adopted being AZ5214E.

S3. Etching a silicon nitride layer on the front side of the wafer A-2 by using a reactive ion etching (RIE) process to obtain a liquid injection trough, then soaking the wafer A-2 in a cleaning agent with the front side up successively, and finally rinsing the wafer with a large amount of deionized water to remove the photoresist to obtain a wafer A-3.

S4. Placing the wafer A-3 into a potassium hydroxide solution with the mass percent concentration of 20% for wet etching with a back side up, performing the etching at the etching temperature of 80° C. for about 2 h until only a film window is reserved in the front side, taking out the wafer, and rinsing the wafer with a large amount of deionized water to obtain a wafer A-4.

S5. Transferring a pattern of a central window from the lithography mask to the front side of the wafer A-4 by exposing in the hard contact mode of the ultraviolet lithography machine for 15 s through the lithography process, then developing in the positive photoresist developer for 50 s, and rinsing the surface with deionized water to obtain a wafer A-5, the photoresist adopted being AZ5214E.

S6. Etching a silicon nitride layer on the back side of the wafer A-5 by using the reactive ion etching (RIE) process to obtain the central window, then soaking the wafer in a cleaning agent with the back side up successively, and finally rinsing the wafer with the cleaning agent to remove the photoresist to obtain a wafer A-6. The central window of the embodiment is located on a central axis of the wafer, which is specifically determined according to a transmission electron microscope sample holder matched with the chip. Due to an etching angle of wet etching for silicon, if the central window is too small, a pyramid-shaped pit is formed and etching ends when etching reaches a certain depth, and etching may not reach the front side; and if the central window is too large, the central window in the front side may be too large, the strength and stability of the window may be affected, and crack may be caused. Depending on thicknesses of different substrates, the size of the central window is determined by allowing etching to end till the front side of the substrate such that the film window in the front side is not greater than 10 μm*30 μm.

S7. Placing the wafer A-6 into a potassium hydroxide solution with the mass percent concentration of 20% for wet etching with the back side up, performing the etching at the etching temperature of 80° C. for about 2 h until only the film window is reserved in the front side, taking out the wafer, and rinsing the wafer with a large amount of deionized water to obtain a wafer A-7.

S8. Performing laser scribing on the wafer A-7 to obtain an independent chip.

A bottom chip is prepared by:

S1. Preparing an Si(100) wafer (that is, silicon substrate) B-1 with silicon nitride or silicon oxide layers on two sides, a size of the wafer being 4 inches, a thickness of the wafer being 200 μm, and a thickness of the silicon nitride or silicon oxide layers being 5-200 nm.

S2. Transferring a pattern of a central window from a lithography mask to a front side of the wafer B-1 by exposing in a hard contact mode of an ultraviolet lithography machine for 20 s through a lithography process, then developing in a positive photoresist developer for 65 s, and rinsing a surface with deionized water to obtain a wafer B-2, photoresist adopted being AZ5214E.

S3. Etching a silicon nitride layer on a back side of the wafer B-2 by using a reactive ion etching (RIE) process to obtain the central window, then soaking the wafer in a cleaning agent with the back side up successively, and finally rinsing the wafer with the cleaning agent to remove the photoresist to obtain a wafer B-3. In order to ensure that silicon nitride in all regions of the entire silicon substrate is completely etched, over-etching may be performed in a dry etching step, and is 50-100 nm preferably. A higher degree of over-etching may cause longer machine hour and increased process cost.

S4. Placing the wafer B-3 into a potassium hydroxide solution with the mass percent concentration of 20% for wet etching with the back side up, performing the etching at the etching temperature of 80° C. for about 2 h-3 h until only a film window (10*30 μm) is reserved in the front side, taking out the wafer, and rinsing the wafer with a large amount of deionized water to obtain a wafer B-4. It is appropriate to end silicon etching until the window is exposed on the front side. Excessive etching may cause the window to expand and a silicon nitride film to crack.

S5. Depositing aluminum oxide with a thickness of 20-100 nm on the front side of the wafer B-4 by atomic layer deposition as an insulating layer to obtain a wafer B-5. In this step, a hard template is used to shield the central window from being covered by the aluminum oxide.

S6. Transferring a pattern of a heating layer from the lithography mask to the front side of the wafer B-5 by exposing in the hard contact mode of the ultraviolet lithography machine for 15 s through the lithography process, then developing in the positive photoresist developer for 50 s, and rinsing the surface with deionized water to obtain a wafer B-6, the photoresist adopted being AZ5214E.

S7. Evaporating a film with a thickness of 50 nm-200 nm on the front side of the wafer B-6 by electron beam evaporation as the heating layer, then soaking the wafer in a cleaning agent with the front side up successively for peeling, and finally rinsing the wafer with deionized water to remove the photoresist and reserve a metal resistance wire as a heating resistance wire, so as to obtain a wafer B-7. The heating layer may be made of a metal or semiconductor material (including one or more of platinum, rhodium, tungsten, molybdenum, silicon carbide, tungsten carbide, molybdenum carbide, etc.). A high melting point is required ensure heating to a high temperature (>1000° C.). The thickness of the heating layer is 50-200 nm. If the thickness is too large, the processing time may be prolonged, and target material consumption and cost may be increased. If the thickness is too small, the resistance wire may be damaged when heated to the high temperature.

S8. Depositing silicon oxide/silicon nitride with a thickness of 30-100 nm on the front side of the wafer B-7 by using a PECVD process to obtain a wafer B-8. If the thickness is too large, the stress of the film is so high that the film wrinkles. If the thickness is too small, film uniformity is poor. The moderate thickness is 30-100 nm.

S9. Transferring an electrode pattern from the lithography mask to the front side of the wafer B-8 by exposing in the hard contact mode of the ultraviolet lithography machine for 15 s through the lithography process, then developing in the positive photoresist developer for 50 s, and cleaning the surface with deionized water to obtain a wafer B-9, the photoresist adopted being AZ5214E.

S10. Evaporating a layer of electrode material on the front side of the wafer B-9 by electron beam evaporation, then soaking the wafer in acetone with the front side up successively for peeling, and finally rinsing the wafer with deionized water to remove the photoresist and reserve metal electrodes to obtain a wafer B-10. The electrode material may be made of Au, Pt, Ti, Cu, amorphous C and other metal materials, with a thickness of 30-200 nm. In order to ensure good adhesion between the metal and the silicon substrate, metal Cr of 3-10 nm is usually used as a transition layer, and then a layer of metal electrode is evaporated. The transition layer should not be too thick or too thin. If the transition layer is too thick, the stress of the metal film may be increased, and subsequent evaporated metal may have poor adhesion and peel off. If the transition layer is too thin, a film cannot be formed, and the adhesion may also decrease.

S11. Performing laser scribing on the wafer B-10 to obtain an independent chip.

Assembling is performed:

Performing assembling on the top chip and the bottom chip under a microscope. The central windows of the top chip and the bottom chip are required to be aligned. If the central windows are skewed, the central window may be too small to be found. If the central windows are not aligned, electron beams may fail to pass through.

Example 11

A gold nanoparticle colloidal solution sample was injected into the central window via the sample injection ports of the transmission electron microscope in-situ electrothermal coupling chip obtained in Example 10, and then placed in the transmission electron microscope for observation after encapsulation. It is found that after heating up the heating wire, nanoparticles can be stable in a solution for a long time, and pictures taken during heating in the electron microscope are stable, which indicates that the drift rate of the transmission electron microscope in-situ electrothermal coupling chip is low.

Example 12

Platinum nanoparticles were injected into the central window via the sample injection ports of the transmission electron microscope in-situ electrothermal coupling chip obtained in Example 10, and then placed in the transmission electron microscope for observation after encapsulation. It is found that two-dimensional lattice fringes of atomic structure arrangement of the nanoparticles may be clearly seen, which indicates that the imaging resolution of the transmission electron microscope in-situ electrothermal coupling chip can reach atomic-level.

Although the embodiments of the present disclosure have been shown and described above, it can be understood that the above embodiments are illustrative and not restrictive, and that changes, modifications, substitutions and variations can be made by those skilled in the art without departing from the principles and spirit of the present disclosure.

What is claimed is:

1. A transmission electron microscope in-situ electrothermal coupling chip, structurally comprising a top chip and a bottom chip combined via a metal bonding layer, the top chip and the bottom chip each comprising a front side and a back side, the front side of the top chip being directly bonded to the front side of the bottom chip via the metal bonding layer to be self-sealed to form a chamber, and the top chip and the bottom chip being each made of a silicon substrate with silicon nitride or silicon oxide on two sides, wherein a structure of the top chip is, from the front side to the back side, a first silicon nitride layer or a first silicon oxide layer, the silicon substrate of the top chip, a second silicon nitride layer or a second silicon oxide layer, a first central window is located in a center of the top chip and penetrates through the first silicon nitride layer or the first silicon oxide layer on the front side of the top chip and the silicon substrate of the top chip, and two sample injection ports are disposed symmetrically with respect to the first central window and penetrate through an entirety of the top chip;

a structure of the bottom chip is, from the front side to the back side, an electrode material layer, a transition layer, a third silicon nitride layer or a third silicon oxide layer, a heating layer, an insulating layer, a fourth silicon nitride layer or a fourth silicon oxide layer, the silicon substrate of the bottom chip, and a fifth silicon nitride layer or a fifth silicon oxide layer; a second central window is located in a center of the bottom chip and formed by etching the silicon substrate of the bottom chip and the fifth silicon nitride layer or the fifth silicon oxide layer away to reserve the fourth silicon nitride layer or the fourth silicon oxide layer on the front side of the bottom chip; the heating layer is provided with four contact electrodes and an annular heating wire, the four contact electrodes are disposed at an edge of the transmission electron microscope in-situ electrothermal coupling chip, the annular heating wire comprises a plurality of series-connected arc lines, the annular heating wire comprises two slits located at connections between the plurality of series-connected arc lines, a front end of a working electrode of the electrode material layer is disposed at one of the two slits that is located in a center of the second central window; and an area of the top chip is smaller than an area of the bottom chip, and the first central window of the top chip and the second central window of the bottom chip are aligned.

2. The transmission electron microscope in-situ electrothermal coupling chip according to claim 1, wherein an external dimension of the bottom chip is 2 mm*2 mm-10 mm*10 mm.

3. The transmission electron microscope in-situ electro-thermal coupling chip according to claim 1, wherein a thickness of the metal bonding layer is 50 nm-2000 nm; and the metal bonding layer is made of a metal having a melting point less than 1100° C.

4. The transmission electron microscope in-situ electro-thermal coupling chip according to claim 1, wherein the metal bonding layer is made of In, Sn or Al.

5. The transmission electron microscope in-situ electro-thermal coupling chip according to claim 1, wherein a thickness of the silicon substrate of the top chip and a thickness of the silicon substrate of the bottom chip are 50 μm-500 μm.

6. The transmission electron microscope in-situ electro-thermal coupling chip according to claim 1, wherein the first central window and the second central window are square central windows.

7. The transmission electron microscope in-situ electro-thermal coupling chip according to claim 1, wherein an electrode material of the electrode material layer is Au, Pt, Ti, Cu or amorphous C metal materials, and the electrode material layer is provided with the working electrode, a counter electrode and a reference electrode, wherein the front end of the working electrode is opposite to a center of the counter electrode.

8. The transmission electron microscope in-situ electro-thermal coupling chip according to claim 1, wherein the transition layer is made of metal Cr.

9. The transmission electron microscope in-situ electro-thermal coupling chip according to claim 1, wherein the annular heating wire is made of metallic gold, platinum, palladium, rhodium, molybdenum, tungsten, platinum-rhodium alloy or non-metallic molybdenum carbide; the heating layer is set as two equivalent circuits, and the two equivalent circuits are controlled by separate current source meters and voltage source meters; and one of the two equivalent circuits is used for supplying power to produce heat, and a second of the two equivalent circuits is used for monitoring a resistance value of the annular heating wire after heating in real time.

10. The transmission electron microscope in-situ electro-thermal coupling chip according to claim 1, wherein the insulating layer is an aluminum oxide layer.

\* \* \* \* \*